(12) United States Patent
Hu et al.

(10) Patent No.: US 9,812,398 B2
(45) Date of Patent: Nov. 7, 2017

(54) SEMICONDUCTOR MEMORY DEVICE HAVING MEMORY CELLS PROVIDED IN A HEIGHT DIRECTION

(71) Applicant: Toshiba Memory Corporation, Minato-ku (JP)

(72) Inventors: Ming Hu, Yokkaichi (JP); Toshiyuki Takewaki, Yokkaichi (JP); Seiichi Omoto, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/849,061

(22) Filed: Sep. 9, 2015

(65) Prior Publication Data

US 2016/0268191 A1 Sep. 15, 2016

Related U.S. Application Data

(60) Provisional application No. 62/132,822, filed on Mar. 13, 2015.

(51) Int. Cl.
*H01L 29/10* (2006.01)
*H01L 31/036* (2006.01)
(Continued)

(52) U.S. Cl.
CPC .... *H01L 23/53271* (2013.01); *H01L 27/1157* (2013.01); *H01L 27/11582* (2013.01)

(58) Field of Classification Search
CPC ........... H01L 27/11553; H01L 27/1158; H01L 27/11582; H01L 27/11556
(Continued)

(56) References Cited

U.S. PATENT DOCUMENTS

2010/0123180 A1* 5/2010 Takano ............ H01L 27/11521
257/324
2011/0092033 A1* 4/2011 Arai .................. H01L 27/11556
438/152
(Continued)

FOREIGN PATENT DOCUMENTS

| JP | 2008-016546 | 1/2008 |
| JP | 2012-156451 | 8/2012 |
| JP | 2013165224 | 8/2013 |

*Primary Examiner* — Olik Chaudhuri
*Assistant Examiner* — Wilner Jean Baptiste
(74) *Attorney, Agent, or Firm* — Oblon, McClelland, Maier & Neustadt, L.L.P.

(57) ABSTRACT

According to an embodiment, a semiconductor memory device comprises: a memory string comprising a plurality of memory cells connected in series therein; and a contact electrically connected to one end of the memory string. The memory string comprises a plurality of control gate electrodes, and a semiconductor layer. The contact comprises a contact layer, the contact layer having a plate-like shape whose longer direction is a first direction parallel to the substrate, and the contact layer having its lower surface electrically connected to the one end of the semiconductor layer. Moreover, the contact layer includes a metal layer, a silicon based layer, and a second conductive layer. The metal layer includes tungsten. The silicon based layer includes a material including silicon. The second conductive layer covers side surfaces of the metal layer and the silicon based layer.

20 Claims, 26 Drawing Sheets

(51) Int. Cl.
   *H01L 31/112* (2006.01)
   *H01L 23/532* (2006.01)
   *H01L 27/11582* (2017.01)
   *H01L 27/1157* (2017.01)

(58) Field of Classification Search
   USPC .......................................................... 257/324
   See application file for complete search history.

(56) References Cited

U.S. PATENT DOCUMENTS

| | | | |
|---|---|---|---|
| 2011/0199825 A1* | 8/2011 | Han | G11C 16/10 365/185.11 |
| 2012/0193696 A1 | 8/2012 | Fukushima | |
| 2013/0207193 A1 | 8/2013 | Haneda et al. | |

* cited by examiner

SEMICONDUCTOR MEMORY DEVICE HAVING MEMORY CELLS PROVIDED IN A HEIGHT DIRECTION

CROSS-REFERENCE TO RELATED APPLICATIONS

This application is based upon and claims the benefit of U.S. Provisional Patent Application No. 62/132,822, filed on Mar. 13, 2015, the entire contents of which are incorporated herein by reference.

BACKGROUND

Field

Embodiments described herein relate to a semiconductor memory device.

Description of the Related Art

A flash memory that stores data by accumulating a charge in a charge accumulation layer, is known. Such a flash memory is connected by a variety of systems such as NAND type or NOR type, and configures a semiconductor memory device. In recent years, increasing of capacity and raising of integration level of such a nonvolatile semiconductor memory device have been proceeding. Moreover, a semiconductor memory device in which memory cells are disposed three-dimensionally (three-dimensional type semiconductor memory device) has been proposed to raise the integration level of the memory.

DETAILED DESCRIPTION

A semiconductor memory device according to an embodiment comprises: a memory string comprising a plurality of memory cells connected in series therein; and a contact electrically connected to one end of the memory string. The memory string comprises a plurality of control gate electrodes as first conductive layers, and a semiconductor layer. The plurality of control gate electrodes are stacked above a substrate. The semiconductor layer has one end electrically connected to the contact, has as its longer direction a direction perpendicular to the substrate, and faces the plurality of control gate electrodes. The charge accumulation layer is positioned between the control gate electrode and the semiconductor layer. The contact comprises a contact layer, the contact layer having a plate-like shape whose longer direction is a first direction parallel to the substrate, and the contact layer having its lower surface electrically connected to the end of the semiconductor layer. Moreover, the contact layer includes a metal layer, a silicon based layer, and a second conductive layer. The metal layer includes tungsten. The silicon based layer includes a material including silicon. The second conductive layer covers side surfaces of the metal layer and the silicon based layer.

Next, nonvolatile semiconductor memory devices according to embodiments will be described in detail with reference to the drawings. Note that these embodiments are merely examples, and are not shown with the intention of limiting the present invention. Moreover, each of the drawings of the nonvolatile semiconductor memory devices employed in the embodiments below is schematic, and thicknesses, widths, ratios, and so on, of layers are different from those of the actual nonvolatile semiconductor memory devices.

The embodiments below relate to nonvolatile semiconductor memory devices having a structure in which a plurality of MONOS (Metal-Oxide-Nitride-Oxide-Semiconductor) type memory cells (transistors) are provided in a height direction, each of the MONOS type memory cells including: a semiconductor layer acting as a channel provided in a column shape perpendicularly to a substrate; and a gate electrode layer provided on a side surface of the semiconductor layer via a charge accumulation layer. However, this is also not intended to limit the present invention, and the present invention may be applied also to a memory cell of another form of charge accumulation layer, for example, a SONOS (Semiconductor-Oxide-Nitride-Oxide-Semiconductor) type memory cell, or a floating gate type memory cell, and so on.

First Embodiment

Semiconductor Memory Device

Figure 1:
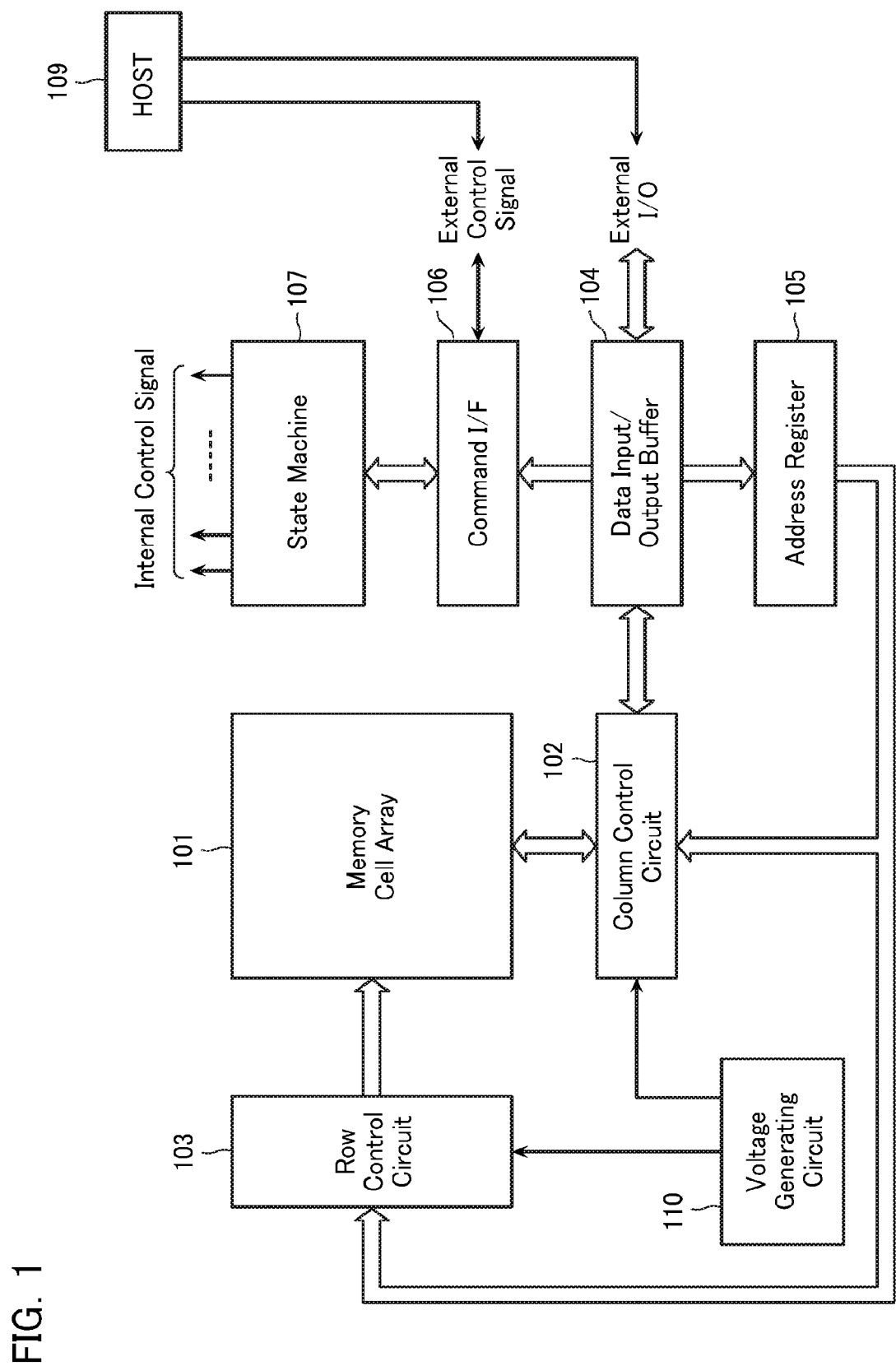
FIG. 1 is a block diagram of a nonvolatile semiconductor memory device according to a first embodiment.

FIG. 1 is a block diagram of a nonvolatile semiconductor memory device according to a first embodiment. This nonvolatile semiconductor memory device includes a memory cell array 101 comprising: a plurality of memory cells MC; and a bit line BL and a word line WL connected to these memory cells MC. Provided in a periphery of this memory cell array 101 are a column control circuit 102 and a row control circuit 103. The column control circuit 102 controls the bit line BL and performs data erase of the memory cell, data write to the memory cell, and data read from the memory cell. The row control circuit 103 selects the word line WL and applies a voltage for data erase of the memory cell, data write to the memory cell, and data read from the memory cell.

A data input/output buffer 104 is connected to an external host 109 via an I/O line. The data input/output buffer 104 receives write data, receives an erase command, outputs read data, and receives address data or command data. The data input/output buffer 104 sends received write data to the column control circuit 102, and receives data read from the column control circuit 102 to be outputted to external. Address data supplied to the data input/output buffer 104 from external is sent to the column control circuit 102 and the row control circuit 103 via an address register 105.

Moreover, command data supplied to the data input/output buffer 104 from the host 109 is sent to a command interface 106.

The command interface 106 receives an external control signal from the host 109, determines whether data inputted to the data input/output buffer 104 is write data or command data or address data, and, if the data is command data, receives the data and transfers the data to a state machine 107 as a command signal.

The state machine 107 performs management of this nonvolatile memory overall, receives command data from the host 109, via the command interface 106, and performs management of read, write, erase, input/output of data, and so on.

In addition, it is also possible for the external host 109 to receive status information managed by the state machine 107 and judge an operation result. Moreover, this status information is utilized also in control of write and erase.

In addition, the state machine 107 controls a voltage generating circuit 110. This control enables the voltage generating circuit 110 to output a pulse of any voltage and any timing.

The pulse formed by the voltage generating circuit 110 can be transferred to any wiring selected by the column control circuit 102 and the row control circuit 103. These column control circuit 102, row control circuit 103, state machine 107, voltage generating circuit 110, and so on, configure a control circuit in the present embodiment.

Figure 2:
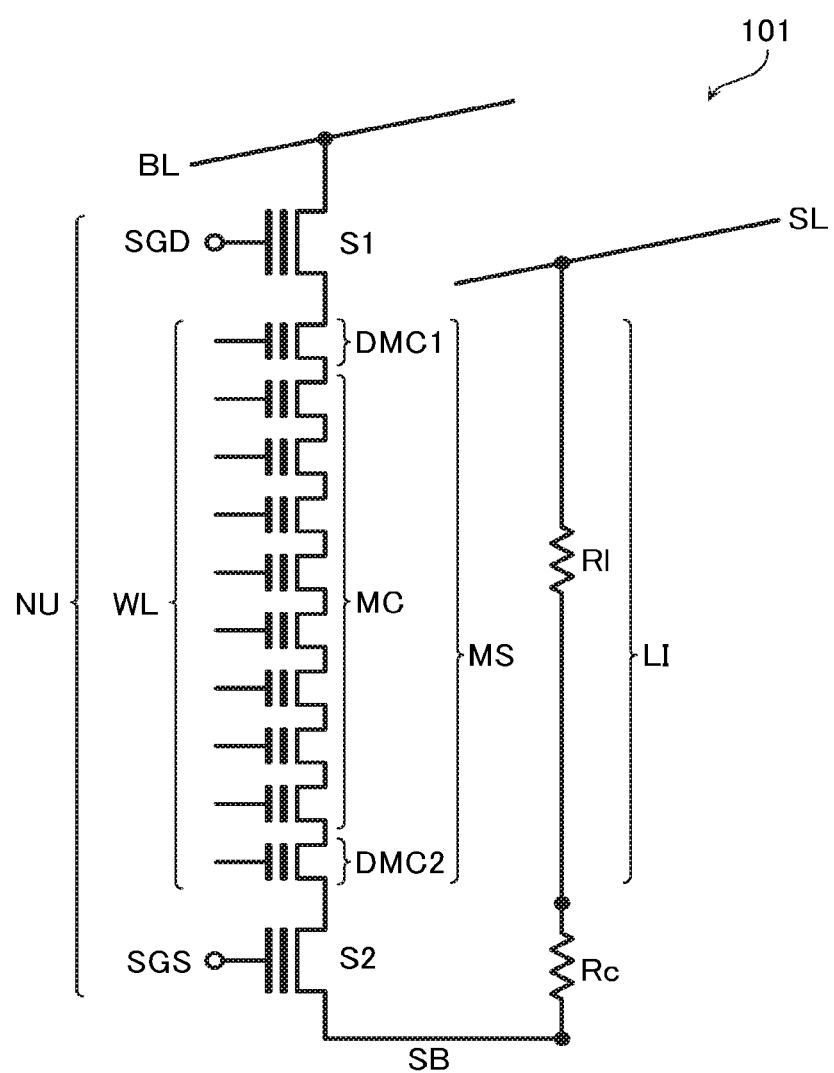
FIG. 2 is a circuit diagram showing a configuration of part of the same nonvolatile semiconductor memory device.

Next, a circuit configuration of the memory cell array 101 will be described with reference to FIG. 2. FIG. 2 is a circuit diagram showing a structure of part of the memory cell array 101.

As shown in FIG. 2, the memory cell array 101 according to the present embodiment comprises: a plurality of the memory cells MC connected in series; and dummy cells DMC1 and DMC2. The dummy cells DMC1 and DMC2 are respectively connected to both ends of these memory cells MC. Gate electrodes of these plurality of memory cells MC and of the dummy cells DMC1 and DMC2 are respectively connected to the word lines WL. Moreover, these plurality of memory cells MC and the dummy cells DMC1 and DMC2 configure a memory string MS.

As shown in FIG. 2, select gate transistors S1 and S2 are respectively connected to both ends of the memory string MS. The select gate transistors S1 and S2 are respectively connected to select gate lines SGD and SGS. Moreover, these memory string MS and select gate transistors S1 and S2 configure a NAND cell unit NU.

One end of the NAND cell unit NU is connected to the bit line BL. Moreover, the other end of the NAND cell unit NU is connected, via a substrate SB and a source contact LI, to a source line SL. Note that a contact resistance Rc occurs at a contact surface of the substrate SB and the source contact LI, and a wiring resistance Rl occurs in a wiring of the source contact LI.

Figure 3:
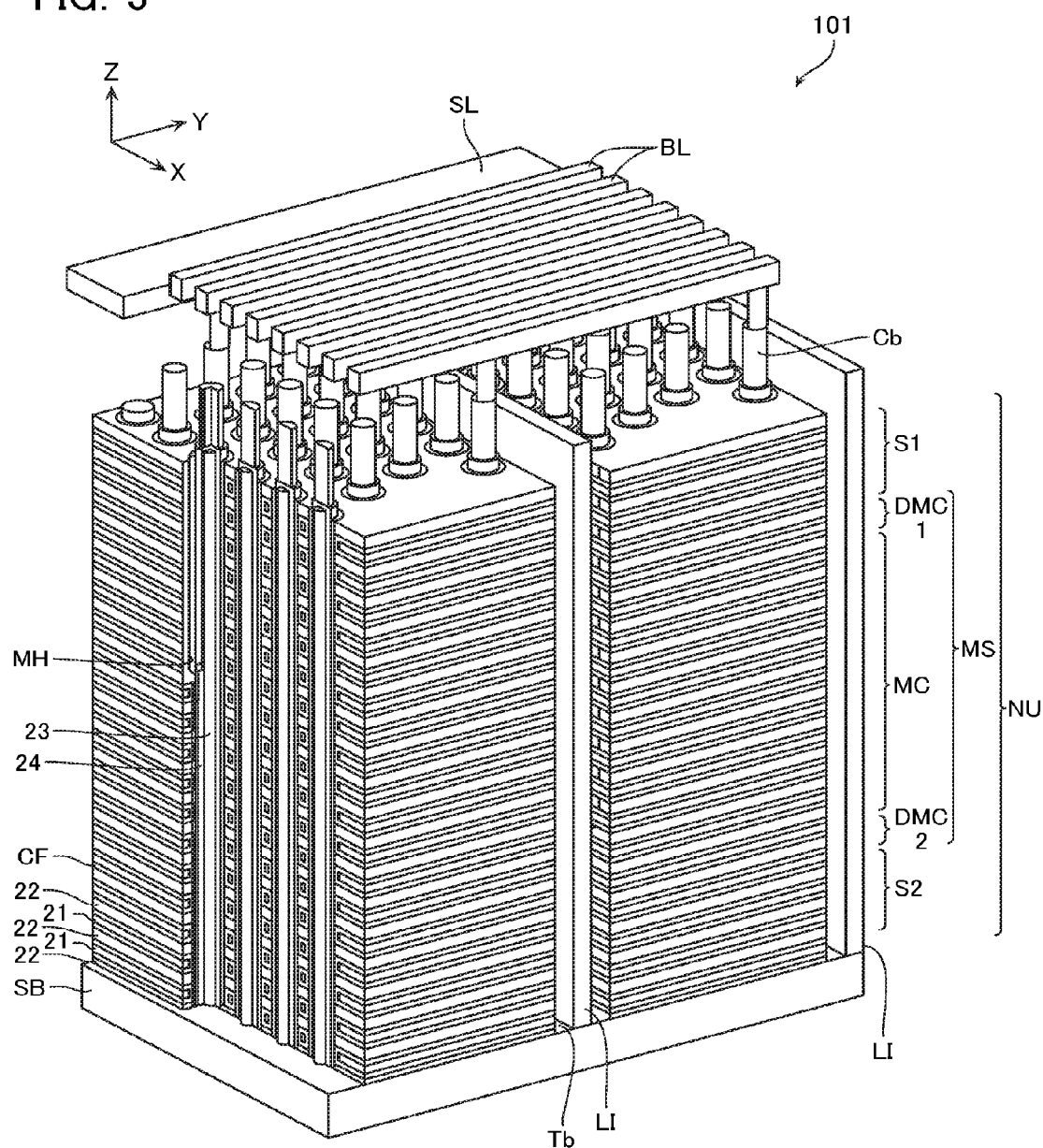
FIG. 3 is a perspective view showing a configuration of part of the same nonvolatile semiconductor memory device.
Figure 4:
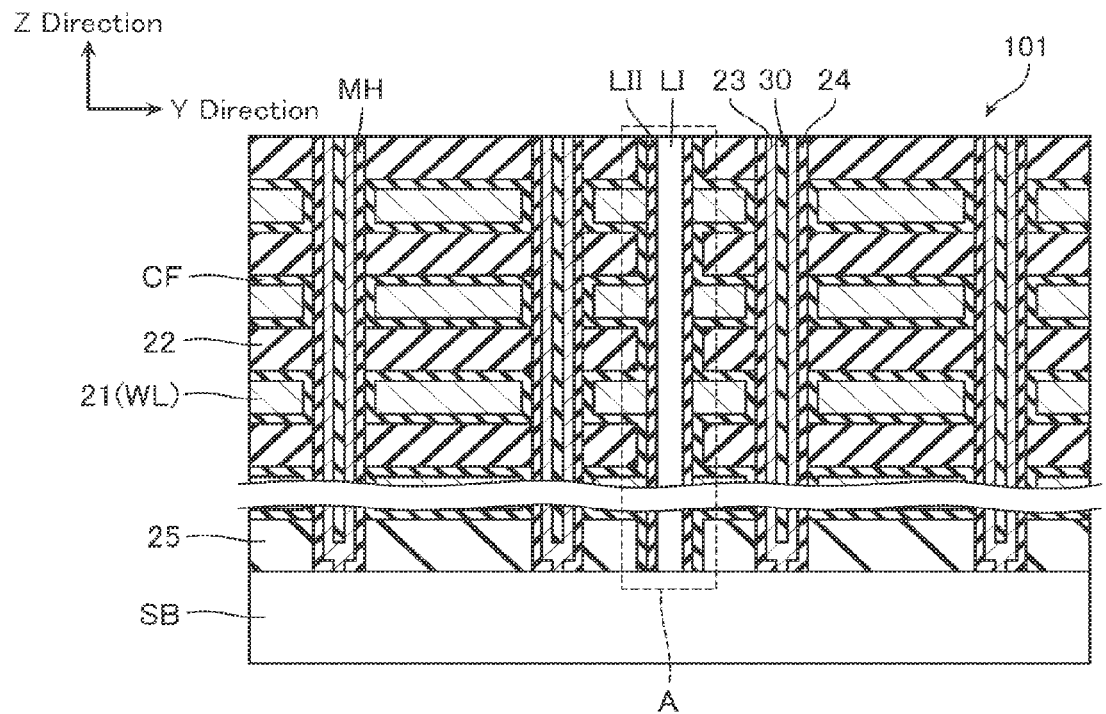
FIG. 4 is a cross-sectional view showing a configuration of part of the same nonvolatile semiconductor memory device.
Figure 5:
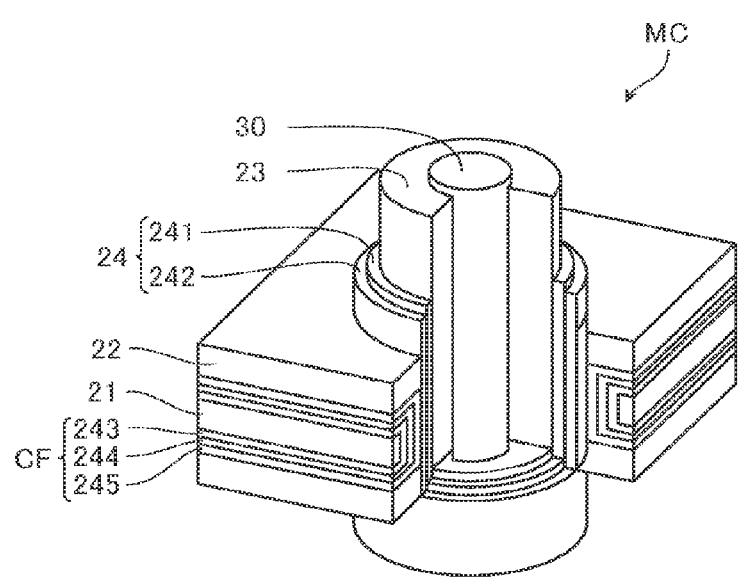
FIG. 5 is a perspective view showing a configuration of part of the same nonvolatile semiconductor memory device.

Next, a configuration of the memory cell array 101 will be described with reference to FIGS. 3 to 5. FIG. 3 is a perspective view showing a configuration of part of the memory cell array 101; and FIG. 4 is a cross-sectional view of the memory cell array 101. Moreover, FIG. 5 is a perspective view showing a configuration of the memory cell MC.

As shown in FIG. 3, the memory cell array 101 has a structure in which inter-layer insulating layers 22 and conductive layers 21 are stacked alternately above a semiconductor substrate SB. Moreover, as shown in FIG. 4, formed in a periphery of the conductive layer 21 is a stacked film CF that includes a block insulating layer 243 (FIG. 5). The conductive layers 21 function as a control gate of the memory cell MC (word line WL), as the source side select gate line SGS, and as the drain side select gate line SGD. The inter-layer insulating layers 22 are disposed above and below these conductive layers 21, and electrically insulate mutual conductive layers 21. The conductive layer 21 is configured from a metal of the likes of tungsten (W), for example, or from a material of a conductive layer such as polysilicon to which an impurity has been added. Moreover, the inter-layer insulating layer 22 is configured from a material having insulating properties, such as silicon oxide ($SiO_2$).

In addition, as shown in FIG. 3, memory holes MH are formed in the inter-layer insulating layer 22 and the conductive layer 21, so as to penetrate a stacked body of the inter-layer insulating layers 22 and conductive layers 21. The memory holes MH are arranged with a certain pitch, for example, in an XY plane. Moreover, formed in the memory hole MH is a semiconductor layer 23 that has a stacking direction (Z direction) as its longer direction. The semiconductor layer 23 faces the stacked body of the inter-layer insulating layers 22 and conductive layers 21, from the inside of the memory hole MH. In addition, the semiconductor layer 23 is configured from the likes of polysilicon. Moreover, the semiconductor layer 23 is covered by a memory layer 24. The memory layer 24 may be configured from a stacked structure of a charge accumulation layer of the likes of a silicon nitride layer and an oxide layer of the likes of a silicon oxide layer. A threshold voltage of the memory cell MC changes by an amount of charge accumulated to this charge accumulation layer, and the memory cell MC stores data corresponding to this threshold voltage.

The semiconductor layer 23 is connected at its upper end to the bit line BL, via a contact Cb. The bit lines BL have a Y direction as their longer direction and are arranged with a certain pitch in an X direction.

Moreover, a lower end of the semiconductor layer 23 is connected to the semiconductor substrate SB. As mentioned above, the lower end of the semiconductor layer 23 is connected, via this semiconductor substrate SB and the later-to-be-described source contact LI, to the source line SL. The source line SL is arranged having the Y direction as its longer direction, similarly to the bit line BL.

Note that the stacked body of the inter-layer insulating layers 22 and conductive layers 21 in the memory cell array 101 is divided on the basis of a block which is a minimum unit of data erase. A trench Tb is formed at a boundary of division, this trench Tb is implanted with an inter-layer insulating layer LII (FIG. 4), and the previously mentioned source contact LI is formed further penetrating that inter-layer insulating layer. This source contact LI comprises a plate-like shape extending in the X direction, is connected at its lower surface to the semiconductor substrate SB, and has its upper end connected to the source line SL.

As shown in FIG. 5, formed in the memory hole MH are, sequentially from its center, a core insulating layer 30, the semiconductor layer 23, and the memory layer 24. The memory layer 24 comprises, for example, a tunnel insulating layer 241 and a charge accumulation layer 242. Moreover, the memory layer 24 contacts the stacked film CF covering the conductive layer 21. The stacked film CF comprises a barrier metal 243, a block high dielectric film 244, and the block insulating layer 245. The tunnel insulating layer 241 and the block insulating layer 245 are configured from, for example, silicon oxide ($SiO_2$). Moreover, the charge accumulation layer 242 is configured from, for example, silicon nitride (SiN). The barrier metal 243 is configured from, for example, a metal nitride such as TiN, WN, or TaN. Moreover, the block high dielectric film 244 is configured from, for example, a metal oxide such as alumina ($Al_2O_3$) or hafnium oxide ($HfO_x$).

Figure 6:
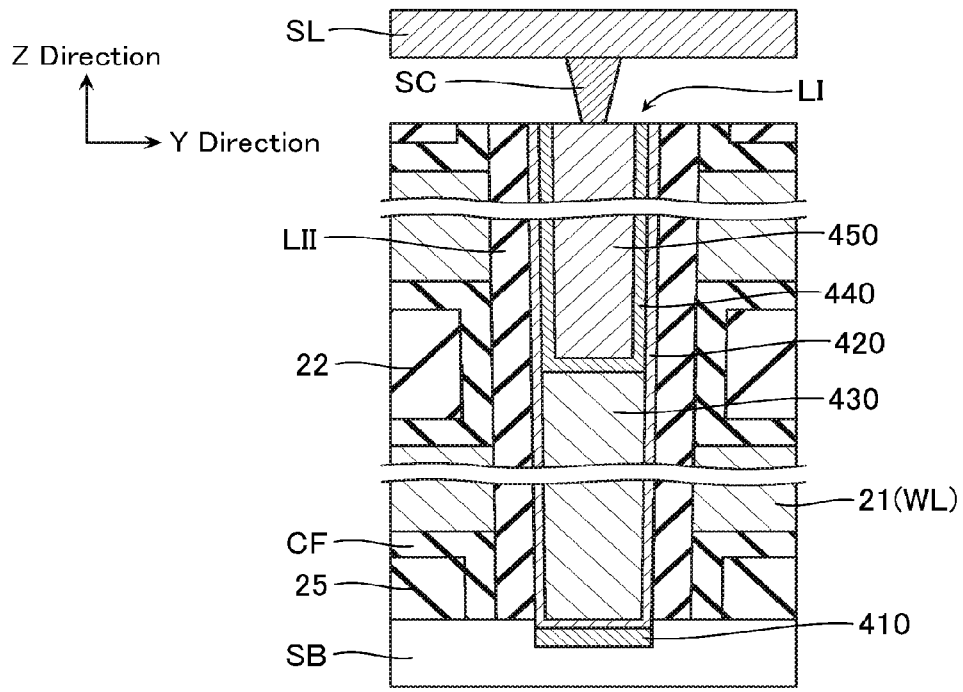
FIG. 6 is a cross-sectional view showing a configuration of part of the same nonvolatile semiconductor memory device.
Figure 7:
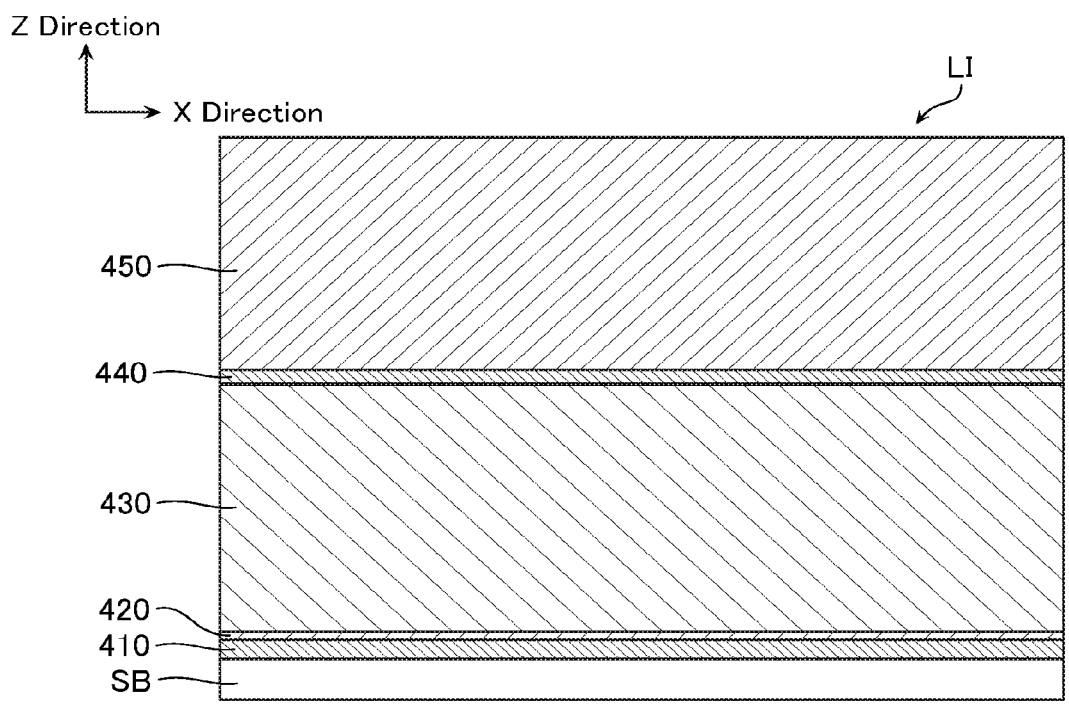
FIG. 7 is a cross-sectional view showing a configuration of part of the same nonvolatile semiconductor memory device.

Next, a configuration of the source contact LI will be described with reference to FIGS. 6 and 7. FIG. 6 is an enlarged view of the portion indicated by A in FIG. 4. Moreover, FIG. 7 is a cross-sectional view of the source contact LI cut in a ZX plane and viewed from the Y direction.

As shown in FIG. 6, the source contact LI according to the present embodiment comprises: a silicide layer 410 formed on the substrate SB; and a barrier layer 420 that covers an upper surface of this silicide layer 410 and a side surface of the inter-layer insulating layer LII. The silicide layer 410 faces a lower surface of the barrier layer 420 and an upper surface of the substrate SB. The silicide layer 410 is configured from, for example, titanium silicide (TiSi$_x$). Moreover, the barrier layer 420 is configured from, for example, titanium nitride (TiN).

In addition, as shown in FIG. 6, the source contact LI according to the present embodiment comprises: a silicon based layer 430 contacting at its lower surface and side surface the barrier layer 420; and a barrier layer 440 covering an upper surface of this silicon based layer 430 and a side surface of the barrier layer 420. In other words, the barrier layer 420 (the second conductive layer) indirectly covers side surface of the metal layer 450 via the barrier layer 430 and covers side surface of the silicon based layer 430 directly. In the present embodiment, the silicon based layer 430 is configured from polysilicon. This polysilicon may be doped with an impurity or may be undoped with an impurity. Note that the silicon based layer 430 may also be configured from a material other than polysilicon, provided the material includes silicon. Moreover, in the present embodiment, the barrier layer 440 is configured from a stacked film of titanium (Ti) and titanium nitride (TiN), tantalum nitride (TaN), or tungsten nitride (WN). However, the likes of material or film configuration of the barrier layer 440 may be appropriately changed, and the barrier layer 440 may also be configured from a single-layer film.

In addition, as shown in FIG. 6, the source contact LI according to the present embodiment comprises a metal layer 450 that contacts a bottom surface and a side surface of the barrier layer 440. The metal layer 450 is configured from a metal such as tungsten (W). Moreover, an upper surface of the metal layer 450 is connected to the source line SL via a contact SC.

Now, as shown in FIG. 6, the metal layer 450 is electrically connected to the substrate SB, via the barrier layer 440, the silicon based layer 430, the barrier layer 420, and the silicide layer 410. Moreover, in the present embodiment, the silicon based layer 430 is configured form polysilicon, and the barrier layer 420 is configured from titanium nitride. Now, resistivity of titanium nitride is lower than that of polysilicon, regardless of whether the polysilicon is doped or not. Therefore, a current flowing between the silicide layer 410 and the metal layer 450 flows mainly via the barrier layer 420 and the barrier layer 440.

Note that as shown in FIG. 6, in the present embodiment, the barrier layer 440 covers a sidewall of the barrier layer 420. Therefore, in the present embodiment, a film thickness of the barrier layer is comparatively thin at a sidewall portion of the silicon based layer 430, and is comparatively thick at a sidewall portion of the metal layer 450.

As shown in FIG. 7, the silicide layer 410, the barrier layer 420, the silicon based layer 430, the barrier layer 440, and the metal layer 450 configuring the source contact LI extend in the X direction. As a result, the source contact LI according to the present embodiment is formed in a plate shape extending in the ZX plane (refer to FIG. 3).

Now, in the present embodiment, the source contact LI is connected at its upper surface to the source lines SL extended in the Y direction and arranged at a certain pitch in the X direction. Therefore, electrons in the source contact LI may move in the X direction. Therefore, the wiring resistance R1 in the X direction in the source contact LI is desirably low (refer to FIG. 2). In order to lower the wiring resistance R1, the source contact LI is preferably configured only from a metal material such as tungsten.

However, as a result of study by the inventors, it was found that if the source contact LI is configured only from tungsten, warping ends up occurring in the substrate. Now, a thermal expansion coefficient differs between a material such as silicon used in the substrate and a metal such as tungsten, hence a tensile stress on the substrate ends up occurring after deposition of tungsten. In particular, it is easy for tensile stress in the ZX plane to increase when the source contact LI is formed in a plate shape extending in the ZX plane. Furthermore, the source contact is connected at its lower surface to the substrate, and has a comparatively broad contact area with the substrate. It is therefore also conceivable that the above-mentioned tensile stress ends up occurring in a broad area, whereby warping of the above-mentioned kind ends up occurring.

Accordingly, as shown in FIG. 6, the source contact LI according to the present embodiment includes the silicon based layer 430 configured from a material including silicon, in addition to the metal layer 450 configured from a metal such as tungsten. The silicon based layer 430 includes, for example, silicon or a silicon oxide film. As a result, content of tungsten can be reduced from in the source contact LI and tensile stress occurring in the substrate SB can be reduced. Moreover, in the present embodiment, the substrate SB also is configured from silicon, hence there is conceivably no great change between the thermal expansion coefficient of the silicon based layer 430 and that of the substrate SB. Therefore, by adopting the source contact LI according to the present embodiment, warping occurring in the substrate SB is suppressed. Note that the silicon based layer 430 is not limited to silicon and a silicon oxide film, and a material whose thermal expansion coefficient does not change greatly from that of the substrate SB may be employed.

In addition, the source contact LI according to the present embodiment adopts a two-layer structure in which the metal layer 450 is provided upward of the silicon based layer 430. Therefore, area in the ZX plane of the metal layer 450 is reduced and furthermore tensile stress is reduced to reduce warping occurring in the substrate SB.

Moreover, in the present embodiment, the barrier layer 440 is provided between the metal layer 450 and the silicon based layer 430. Now, the barrier layer 440 is configured from a material such as titanium nitride (TiN), tantalum nitride (TaN), or tungsten nitride (WN), and a chemical reaction can be prevented from occurring between the metal layer 450 and the silicon based layer 430. Moreover, diffusion of atoms can be prevented from occurring between the metal layer 450 and the silicon based layer 430.

In addition, in the present embodiment, the silicide layer 410 is provided on the substrate SB, and the barrier layer 420 is further provided on this silicide layer 410. Moreover, the barrier layer 420 contacts the barrier layer 440 and is thereby electrically connected to the metal layer 450. Now, in the present embodiment, the silicide layer 410 is configured from titanium silicide whose work function is lower compared to that of silicon. Therefore, an ohmic junction is formed at a boundary of the substrate SB and the source contact LI, and the contact resistance Rc between the substrate SB and the source contact LI is lowered. Moreover, in the present embodiment, the barrier layer 420 is configured from titanium nitride which is a conductive substance. Therefore, the silicide layer 410 and the metal layer 450 are electrically connected by the barrier layer 420. As is clear from the above, in the source contact LI according to the present embodiment, the contact resistance Rc with the substrate SB and the wiring resistance R1 in the X direction in the source contact LI can be lowered, while warping occurring in the substrate SB is suppressed.

[Method of Manufacturing]

A method of manufacturing a nonvolatile semiconductor memory device according to the first embodiment will be described with reference to FIGS. 8 to 19. FIGS. 8 to 19 are cross-sectional views for explaining the method of manufacturing according to the first embodiment.

Figure 8:
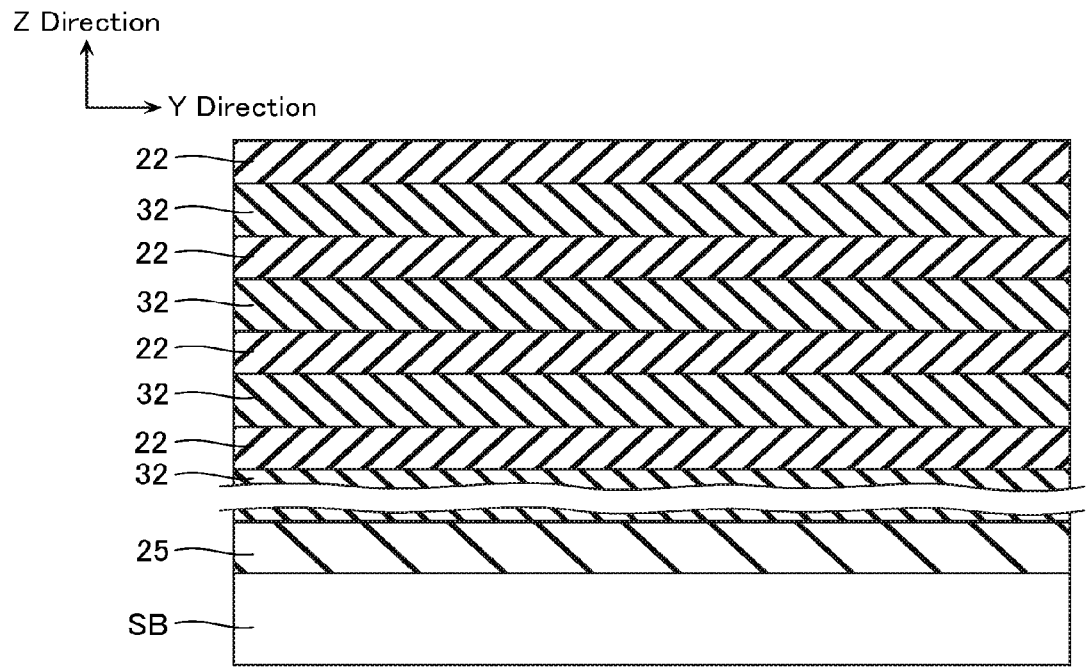
FIG. 8 is a cross-sectional view showing a manufacturing step of the same nonvolatile semiconductor memory device.

As shown in FIG. 8, an insulating layer 25 is stacked on the semiconductor substrate SB. In addition, a plurality of sacrifice layers 32 and the inter-layer insulating layers 22 are stacked alternately on the insulating layer 25. Note that the insulating layer 25 and the inter-layer insulating layer 22 are configured from, for example, silicon oxide ($SiO_2$). Moreover, the sacrifice layer 32 is configured from, for example, silicon nitride (SiN).

Figure 9:
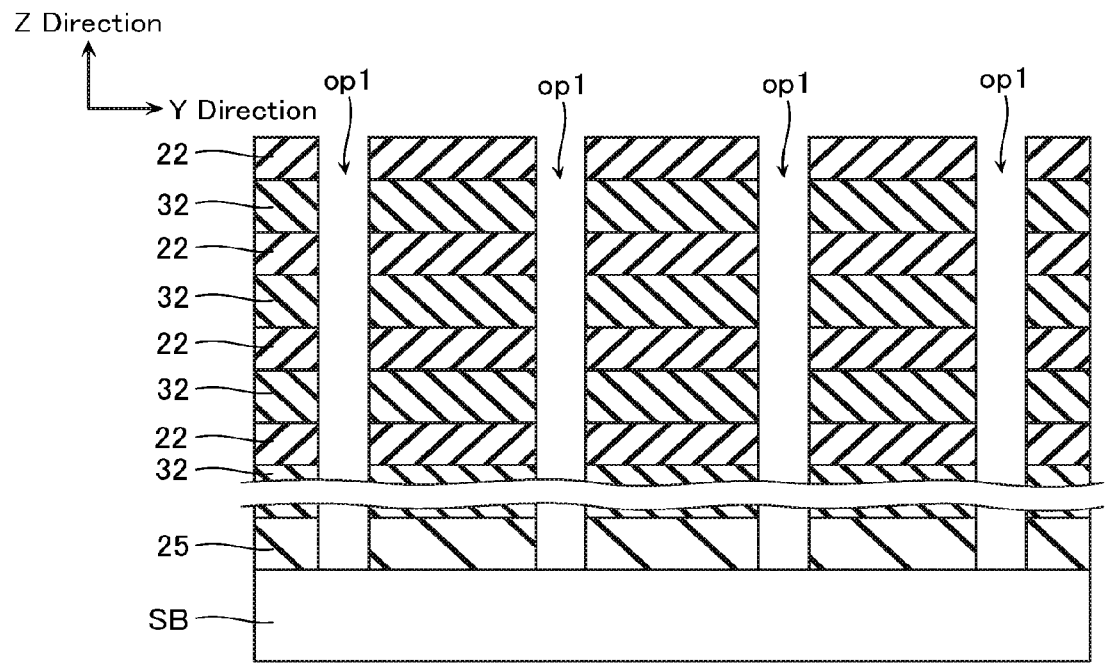
FIG. 9 is a cross-sectional view showing a manufacturing step of the same nonvolatile semiconductor memory device.

As shown in FIG. 9, an opening op1 penetrating the insulating layer 25, the sacrifice layer 32, and the inter-layer insulating layer 22, is formed. The opening op1 will be the memory hole MH.

Figure 10:
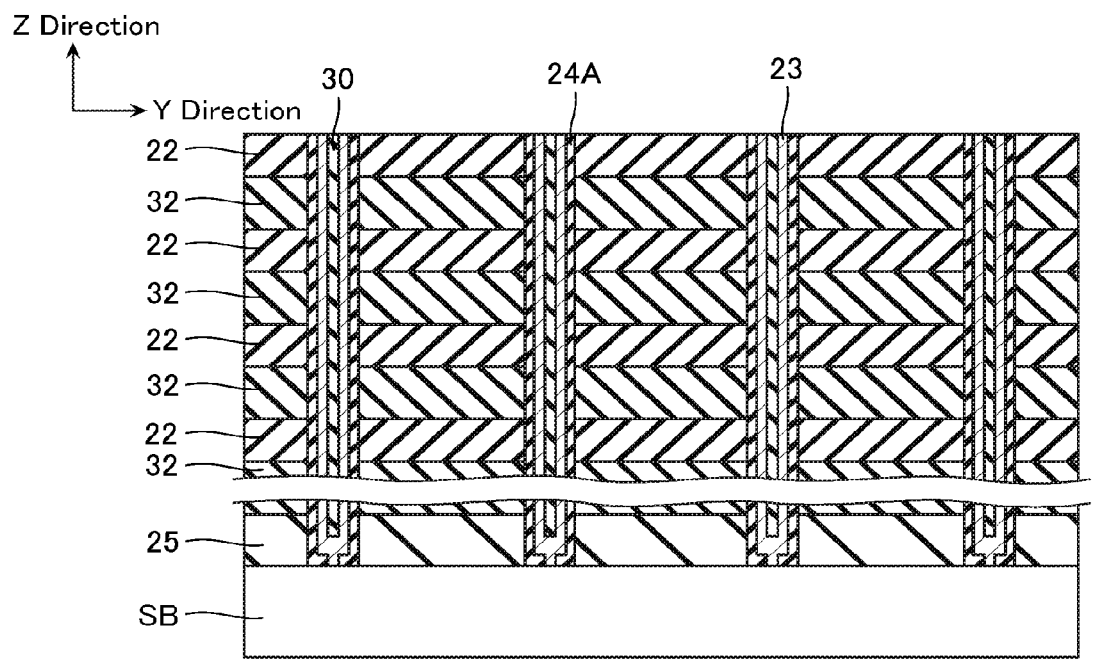
FIG. 10 is a cross-sectional view showing a manufacturing step of the same nonvolatile semiconductor memory device.

As shown in FIG. 10, a memory layer formation layer 24A which will be the memory layer 24, the semiconductor layer 23, and the core insulating layer 30 are formed in the opening op1. The semiconductor layer 23 is formed from the likes of polysilicon, for example. The memory layer 24 is configured from, for example, a stacked film of silicon nitride (SiN) and silicon oxide ($SiO_2$). The core insulating layer 30 is configured from, for example, silicon oxide ($SiO_2$).

Figure 11:
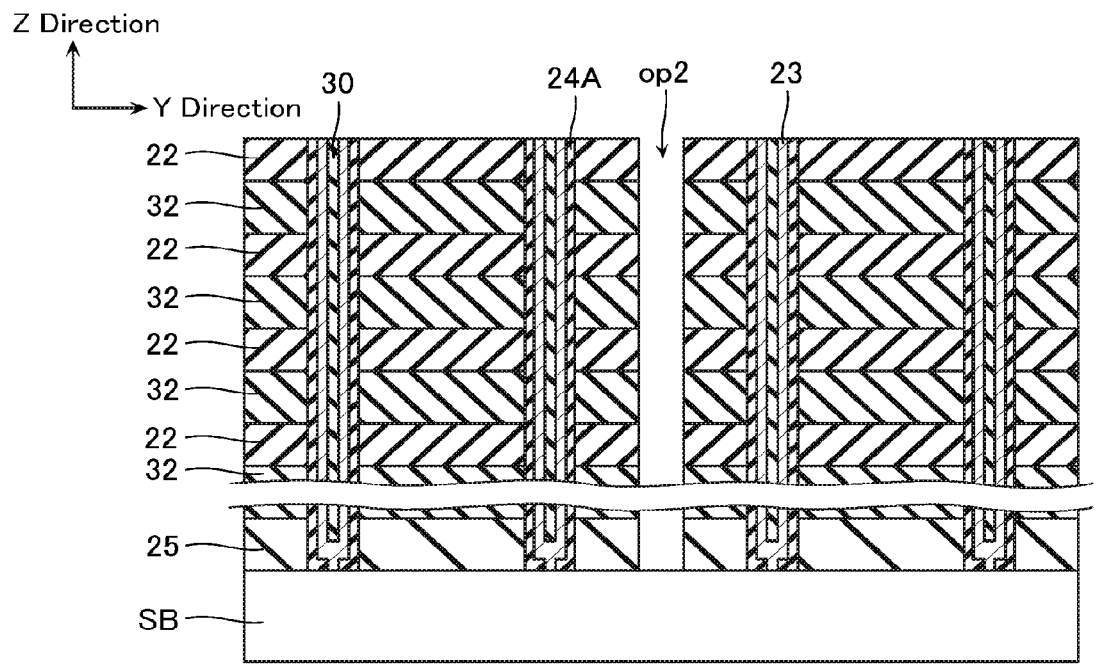
FIG. 11 is a cross-sectional view showing a manufacturing step of the same nonvolatile semiconductor memory device.

As shown in FIG. 11, an opening op2 by which the insulating layer 25, the sacrifice layer 32, and the inter-layer insulating layer 22 are divided, is formed. The opening op2 will be the trench Tb.

Figure 12:
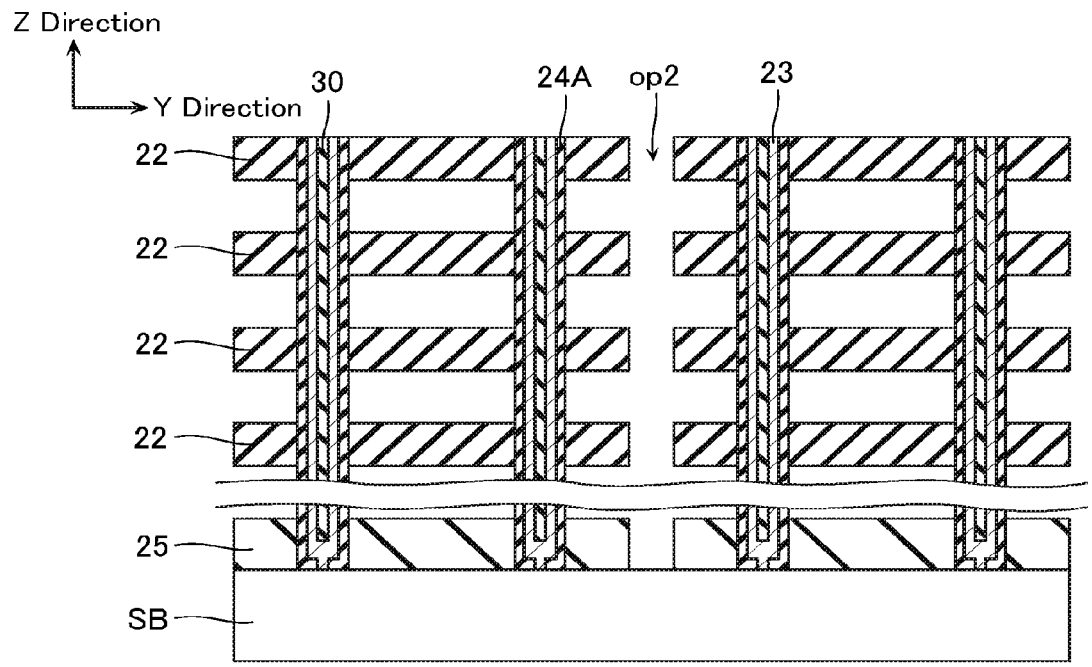
FIG. 12 is a cross-sectional view showing a manufacturing step of the same nonvolatile semiconductor memory device.

As shown in FIG. 12, the sacrifice layer 32 is removed via the opening op2. Removal of the sacrifice layer 32 is performed by, for example, wet etching using a phosphoric acid solution.

Figure 13:
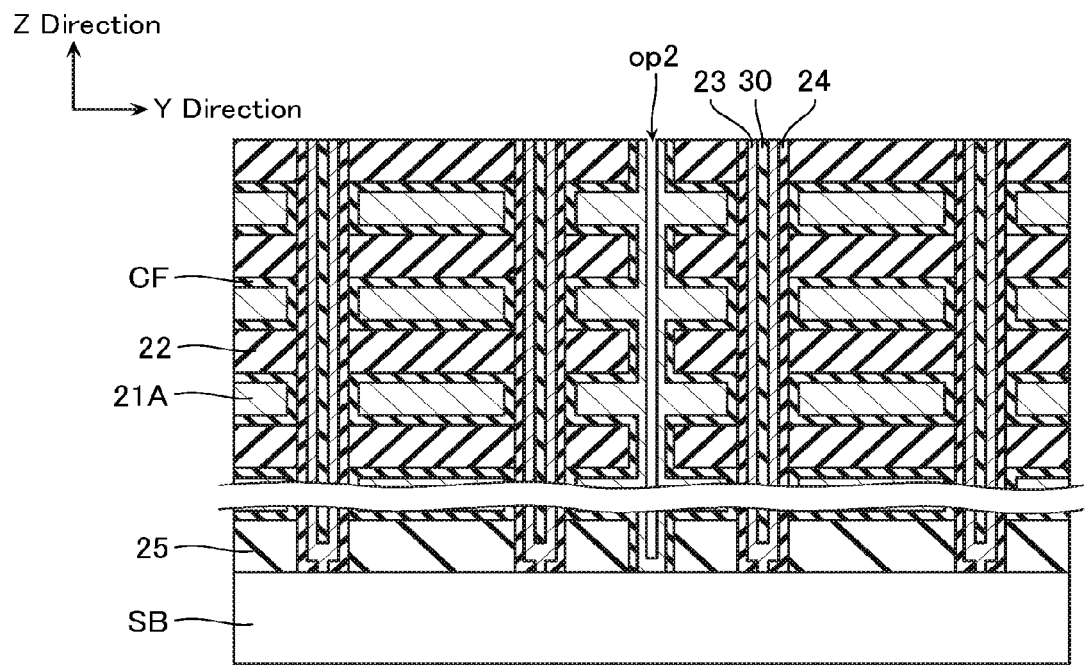
FIG. 13 is a cross-sectional view showing a manufacturing step of the same nonvolatile semiconductor memory device.

As shown in FIG. 13, the stacked film CF and a conductive layer 21A which will be the conductive layer 21 (word line WL), are formed in a cavity where the sacrifice layer 32 was positioned, via the opening op2. Formation of the stacked film CF and the conductive layer 21A is performed by, for example, a CVD (Chemical Vapor Deposition) method.

Figure 14:
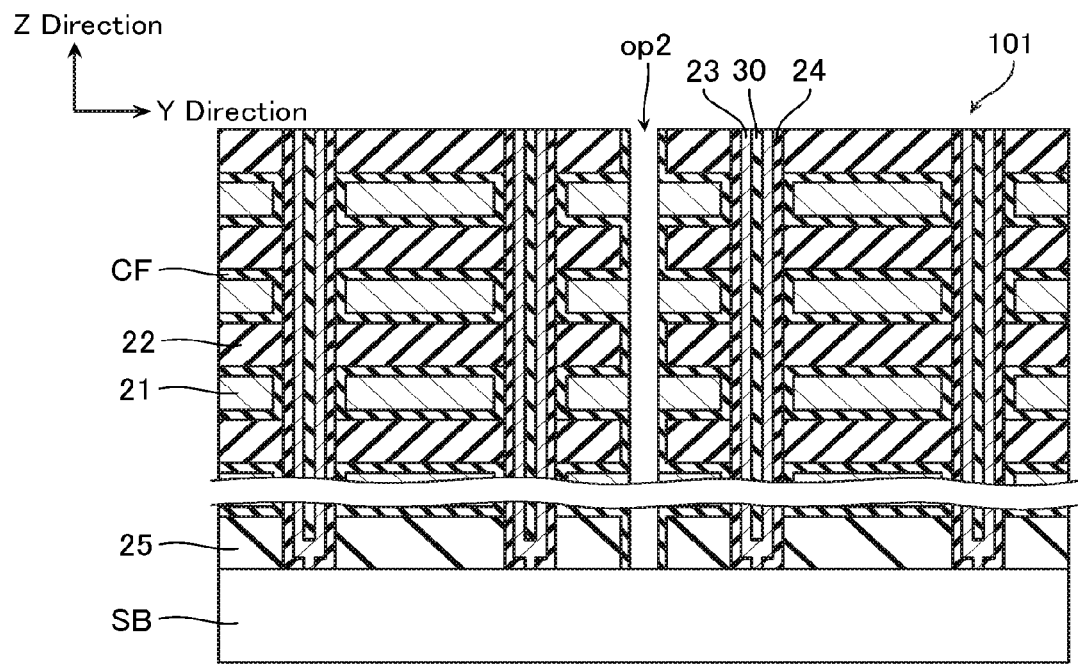
FIG. 14 is a cross-sectional view showing a manufacturing step of the same nonvolatile semiconductor memory device.

As shown in FIG. 14, part of the conductive layer 21A is removed, a portion covering a sidewall of the inter-layer insulating layer 22, of the stacked film CF is exposed, and the conductive layer 21A is divided in the Z direction to form the conductive layer 21.

Figure 15:
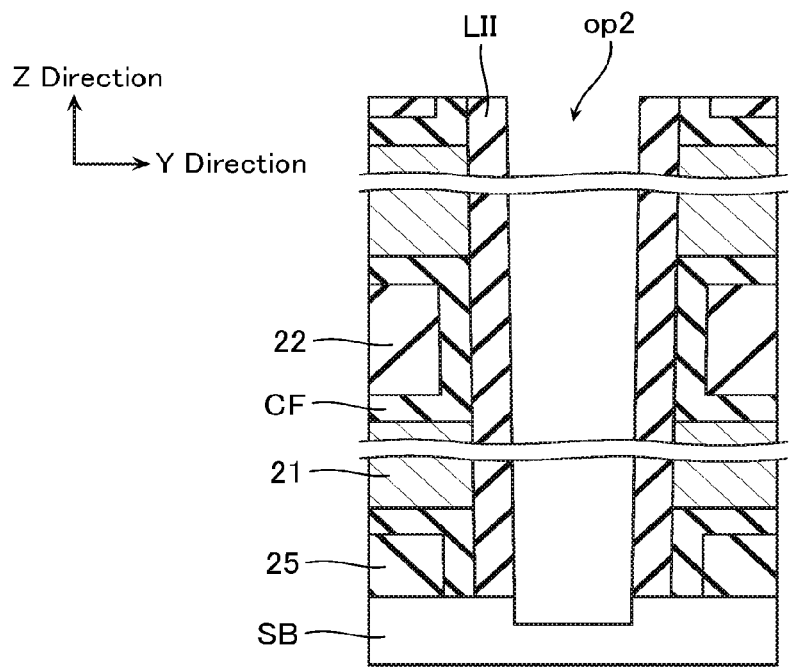
FIG. 15 is a cross-sectional view showing a manufacturing step of the same nonvolatile semiconductor memory device.

As shown in FIG. 15, the inter-layer insulating layer LII is formed in the opening op2. Formation of the inter-layer insulating layer LII is performed by, for example, depositing $SiO_2$ of a certain film thickness in the opening op2, and removing a portion covering an upper surface of the substrate SB, of the deposited $SiO_2$ by anisotropic etching, and so on. Note that as shown in FIG. 15, part of the upper surface of the substrate SB may be removed in this step.

Figure 16:
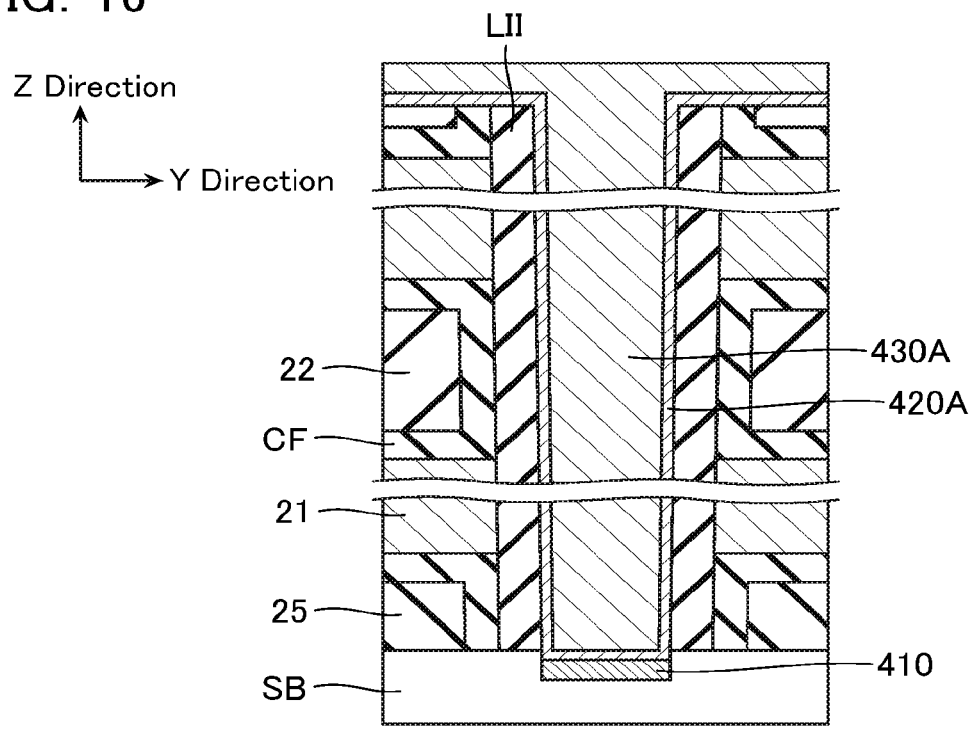
FIG. 16 is a cross-sectional view showing a manufacturing step of the same nonvolatile semiconductor memory device.

As shown in FIG. 16, the silicide layer 410 and a barrier layer formation layer 420A that forms the barrier layer 420, are deposited in the opening op2. Then, a silicon based layer formation layer 430A that forms the silicon based layer 430 is implanted in a portion formed in the opening op2, of the barrier layer formation layer 420A. Formation of the silicide layer 410 is performed by, for example, depositing a metal such as titanium (Ti) in the opening op2. As a result, the upper surface of the substrate SB exposed in the opening op2 is silicided to form the silicide layer 410. Moreover, formation of the barrier layer formation layer 420A is performed by, for example, depositing a material such as titanium nitride.

Figure 17:
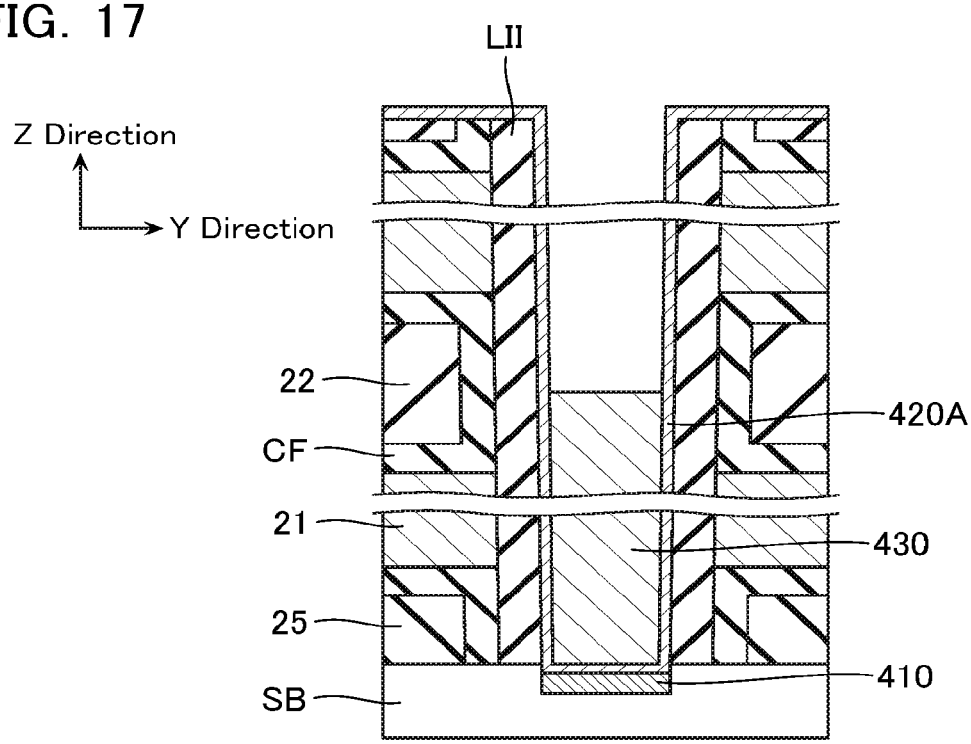
FIG. 17 is a cross-sectional view showing a manufacturing step of the same nonvolatile semiconductor memory device.

As shown in FIG. 17, a means such as etching back is performed, an upper surface of the silicon based layer formation layer 430A is made lower than an upper surface of the inter-layer insulating layer LII to form the silicon based layer 430. Note that dry etching is employed in this step.

Figure 18:
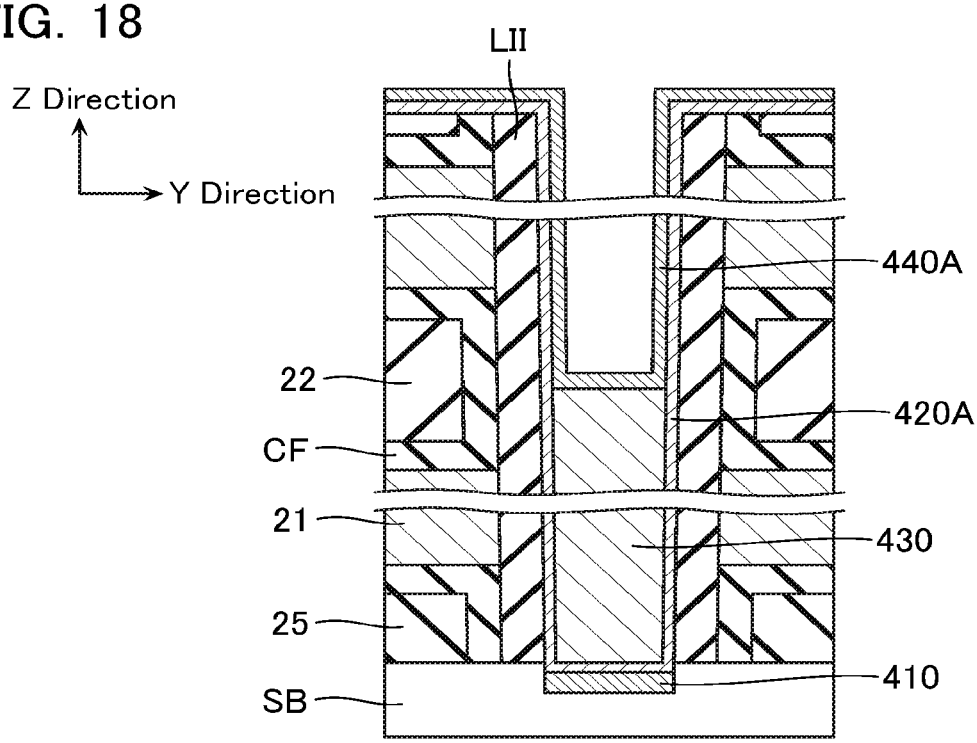
FIG. 18 is a cross-sectional view showing a manufacturing step of the same nonvolatile semiconductor memory device.

As shown in FIG. 18, a barrier layer formation layer 440A that forms the barrier layer 440 is formed on a sidewall of the inter-layer insulating layer LII and an upper surface of the silicon based layer 430.

Figure 19:
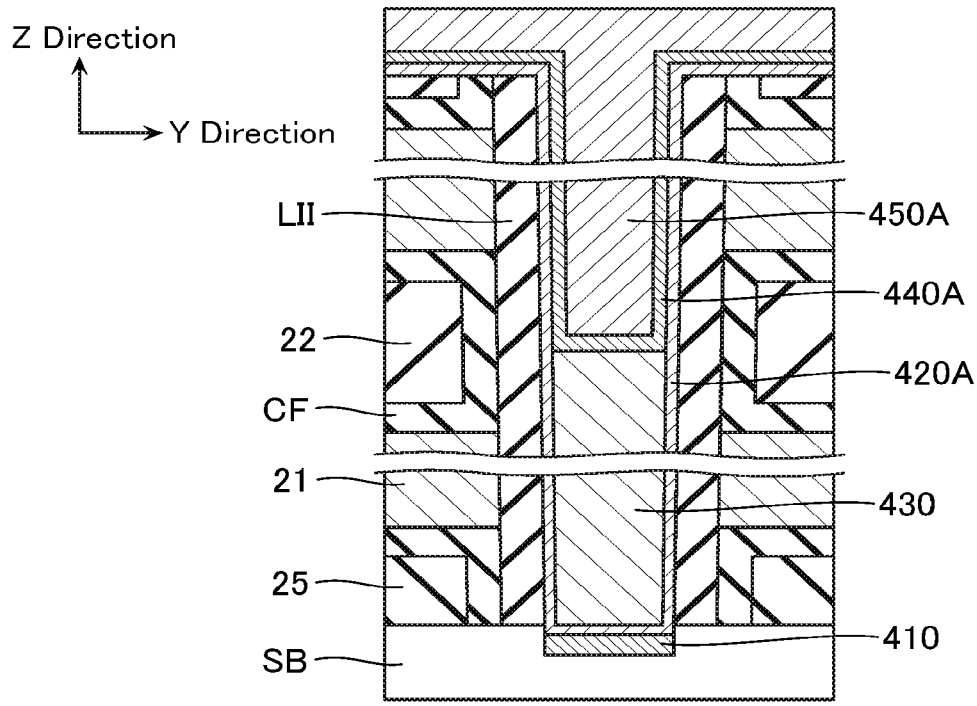
FIG. 19 is a cross-sectional view showing a manufacturing step of the same nonvolatile semiconductor memory device.

As shown in FIG. 19, a metal layer formation layer 450A that forms the metal layer 450 is implanted in a portion formed in the opening op2, of the barrier layer formation layer 440A.

As shown in FIG. 6, planarization by a means such as CMP is performed using as a stopper a portion positioned in an uppermost layer, of the inter-layer insulating layer LII or the inter-layer insulating layer 22 to remove parts of the metal layer formation layer 450A, the barrier layer formation layer 440A, and the barrier layer formation layer 420A. As a result, the barrier layer 420, the barrier layer 440, and the metal layer 450 are formed. Subsequently, the likes of an unillustrated contact or the bit line BL and source line SL are formed, and thereby the semiconductor memory device according to the present embodiment is manufactured.

Modified Examples of Semiconductor Memory Device According to First Embodiment

Modified examples of the semiconductor memory device according to the first embodiment will be described with reference to FIGS. 20 to 26. FIGS. 20 to 26 are cross-sectional views showing configurations of source contacts of semiconductor memory devices according to the modified examples. Note that although the semiconductor memory devices according to these modified examples have configurations of the source contacts that differ from that of the above-described semiconductor memory device, in other respects, they are configured similarly to the above-described semiconductor memory device. Note that in the description below, portions similar to those of the semiconductor memory device described with reference to FIGS. 1 to 7 are assigned with identical reference symbols to those assigned in FIGS. 1 to 7, and descriptions thereof will be omitted.

Figure 20:
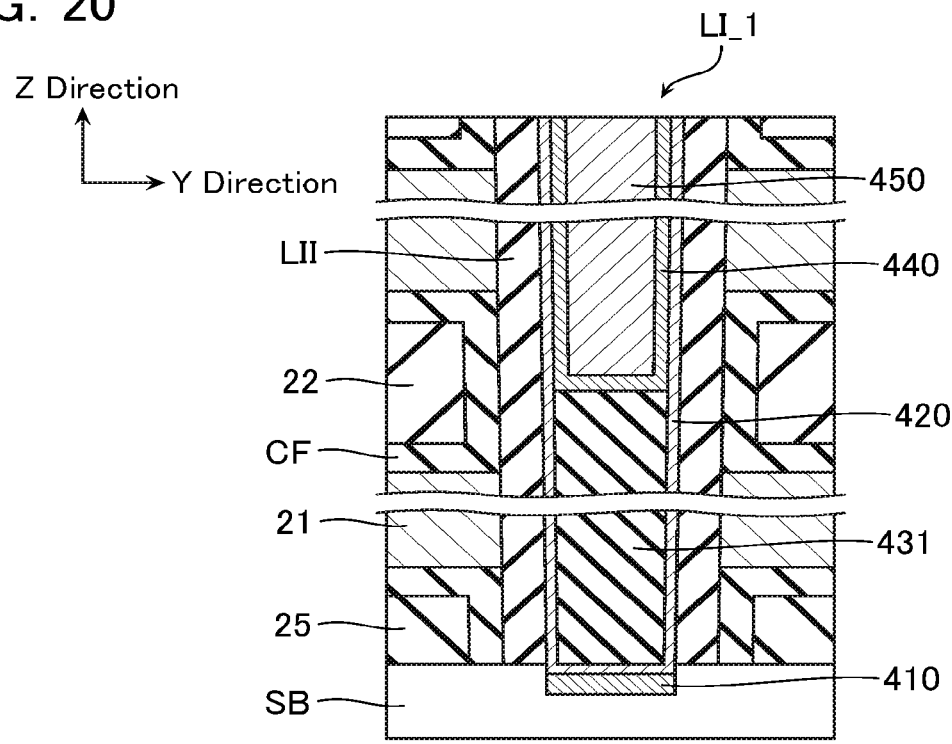
FIG. 20 is a cross-sectional view showing a modified example of the same nonvolatile semiconductor memory device.

FIG. 20 is a cross-sectional view showing a configuration of a source contact LI_1 according to a first modified example of the first embodiment. The source contact LI_1 shown in FIG. 20 has a silicon based layer 431 configured from silicon oxide ($SiO_2$), not polysilicon, and in this respect differs from the source contact LI described with reference to FIG. 6.

The conductive barrier layer 420 is formed on the sidewall of the inter-layer insulating layer LII, hence the silicide layer 410 and the metal layer 450 are electrically connected. Moreover, as described with reference to FIG. 6, the current flowing between the silicide layer 410 and the metal layer 450 flows mainly via the barrier layer 420. Therefore, even when the silicon based layer 431 is configured from silicon oxide as in the present embodiment, electrical resistance between the silicide layer 410 and the metal layer 450 is maintained at a comparatively low value.

In addition, as mentioned above, the thermal expansion coefficient of the metal configuring the metal layer 450 has a positive value, and causes a tensile stress to occur in the substrate SB by being returned to normal temperature after deposition. In contrast, the thermal expansion coefficient of silicon oxide has a negative value. In other words, it causes a stress to occur in a direction of expansion in the substrate SB, by being returned to normal temperature after deposition. Therefore, configuring the silicon based layer 431 from silicon oxide ($SiO_2$) makes it possible to suppress the tensile stress due to the metal layer 450.

Furthermore, as described with reference to FIG. 17, in the first embodiment, dry etching was employed when performing etching back on the silicon based layer formation layer 430A. In contrast, in the present embodiment, the silicon based layer 431 is configured from silicon oxide, hence etching back by wet etching is possible. Therefore, manufacturing at a lower price is possible.

Figure 21:
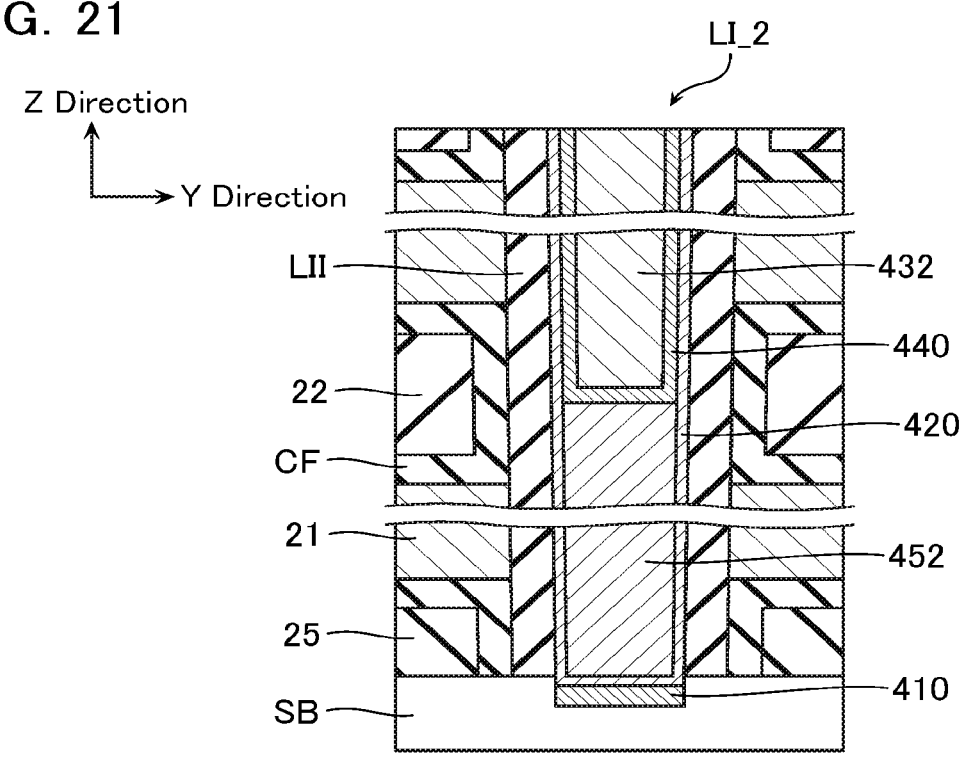
FIG. 21 is a cross-sectional view showing a modified example of the same nonvolatile semiconductor memory device.

FIG. 21 is a cross-sectional view showing a configuration of a source contact LI_2 according to a second modified example of the first embodiment. The source contact LI_2 shown in FIG. 21 has positions of the metal layer and the silicon based layer interchanged compared to the source contact LI described with reference to FIG. 6. That is, in the source contact LI_2, a metal layer 452 contacts at its lower surface and side surface the barrier layer 420, and a silicon based layer 432 is positioned more upwardly than the metal layer 452 and contacts a bottom surface and side surface of the barrier layer 440. Note that the silicon based layer 432 is configured from a material that may be applied to the silicon based layer 430. Moreover, the metal layer 452 is configured from a material that may be applied to the metal layer 450.

Figure 22:
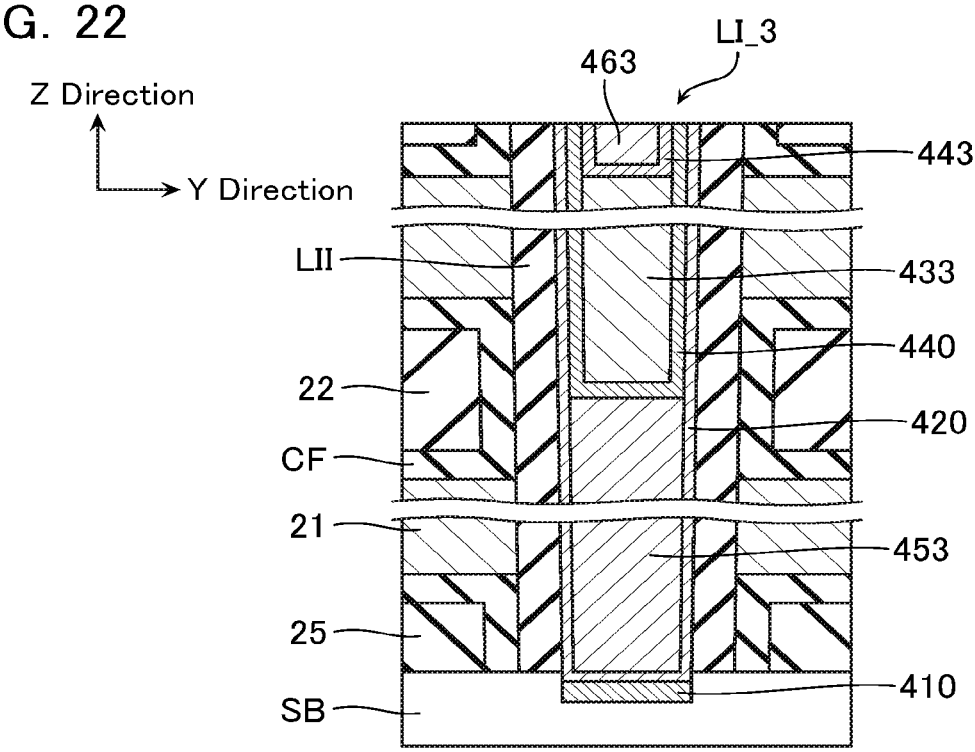
FIG. 22 is a cross-sectional view showing a modified example of the same nonvolatile semiconductor memory device.

FIG. 22 is a cross-sectional view showing a configuration of a source contact LI_3 according to a third modified example of the first embodiment. The source contact LI_3 shown in FIG. 22 comprises the silicide layer 410, a metal layer 453, a silicon based layer 433, and a metal layer 463 that are stacked via the barrier layers 420 and 440, and a barrier layer 443. Note that the metal layer 453 and the metal layer 463 are configured from a material that may be applied to the metal layer 450. Moreover, the silicon based layer 433 is configured from a material that may be applied to the silicon based layer 430. Moreover, the barrier layer 443 is configured from a material that may be applied to the barrier layer 440.

Figure 23:
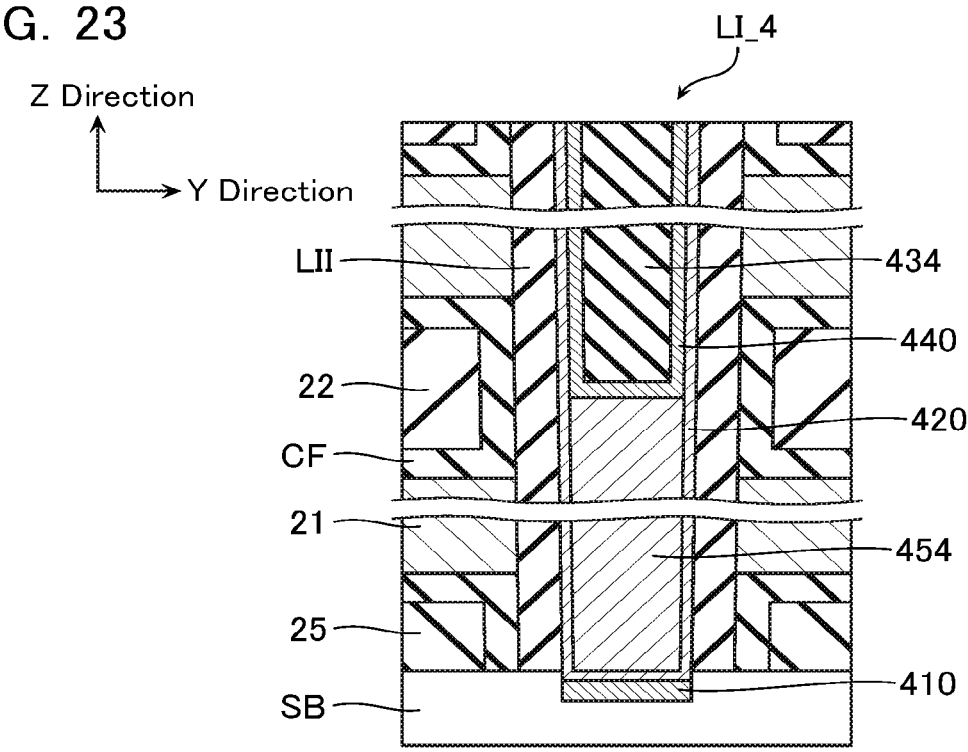
FIG. 23 is a cross-sectional view showing a modified example of the same nonvolatile semiconductor memory device.

FIG. 23 is a cross-sectional view showing a configuration of a source contact LI_4 according to a fourth modified example of the first embodiment. The source contact LI_4 shown in FIG. 23 is configured substantially similarly to the source contact LI_2 described with reference to FIG. 21, but differs in having a silicon based layer 434 configured from silicon oxide. Note that a metal layer 454 is configured from a material that may be applied to the metal layer 450.

Figure 24:
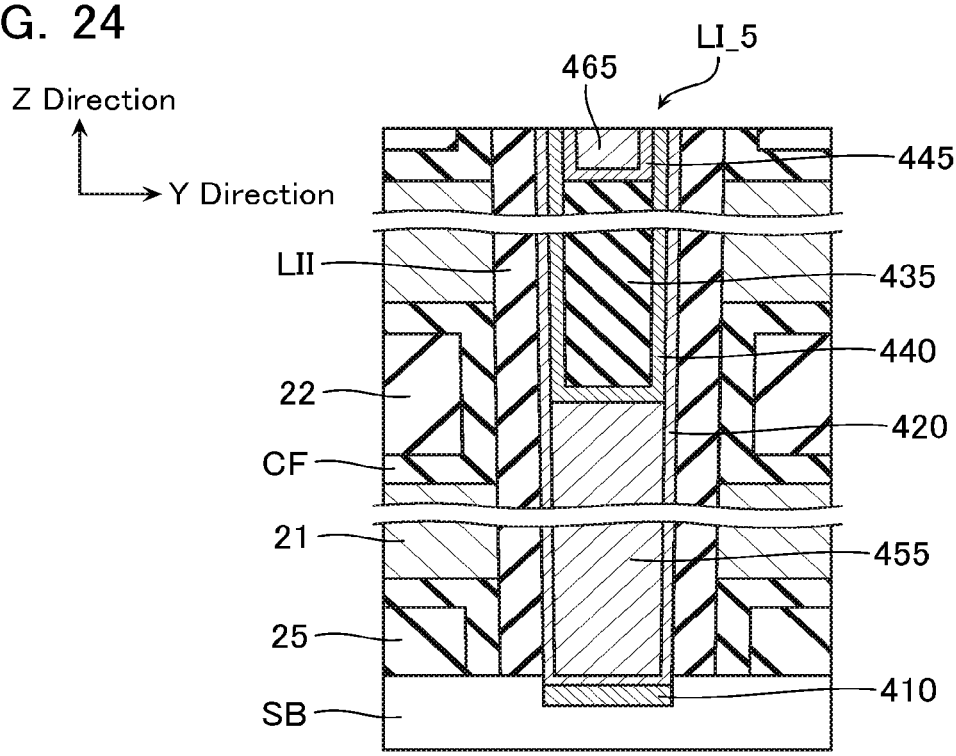
FIG. 24 is a cross-sectional view showing a modified example of the same nonvolatile semiconductor memory device.

FIG. 24 is a cross-sectional view showing a configuration of a source contact LI_5 according to a fifth modified example of the first embodiment. The source contact LI_5 shown in FIG. 24 is configured substantially similarly to the source contact LI_3 described with reference to FIG. 22, but differs in having a silicon based layer 435 configured from silicon oxide. Note that a metal layer 455 and a metal layer 465 are configured from a material that may be applied to the metal layer 450. Moreover, a barrier layer 445 is configured from a material that may be applied to the barrier layer 440.

Figure 25:
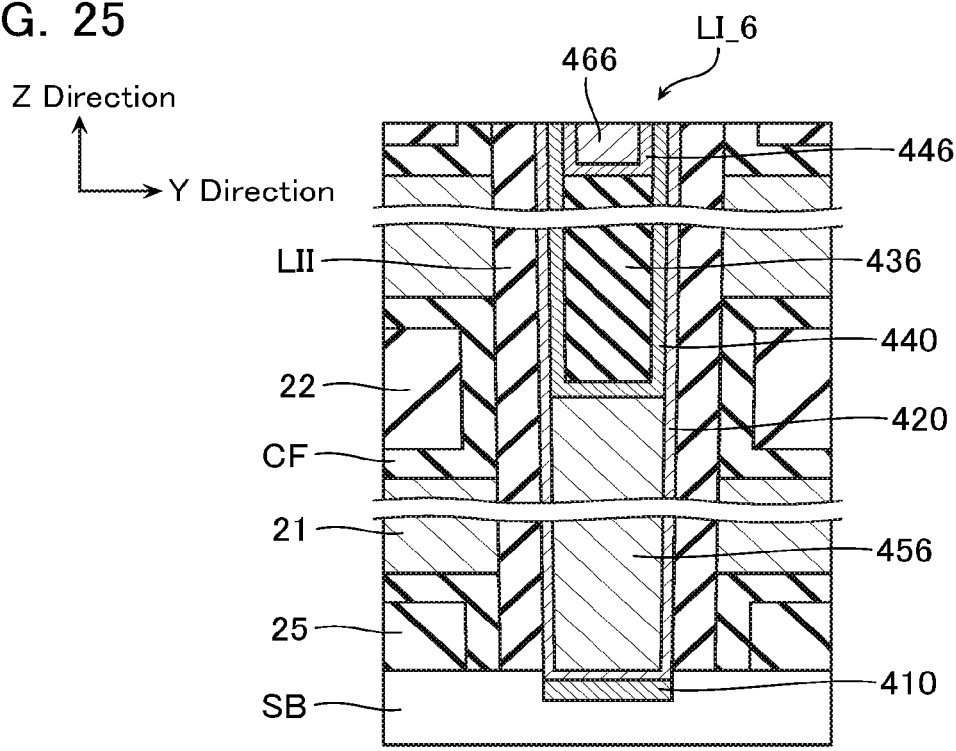
FIG. 25 is a cross-sectional view showing a modified example of the same nonvolatile semiconductor memory device.

FIG. 25 is a cross-sectional view showing a configuration of a source contact LI_6 according to a sixth modified example of the first embodiment. The source contact LI_6 shown in FIG. 25 is configured substantially similarly to the source contact LI_5 described with reference to FIG. 24, but differs in including silicon based layers 456 and 466 configured from polysilicon, instead of the metal layer 455 and the metal layer 465. Note that a silicon based layer 436 is configured from silicon oxide. Moreover, a barrier layer 446 is configured from a material that may be applied to the barrier layer 440.

Figure 26:
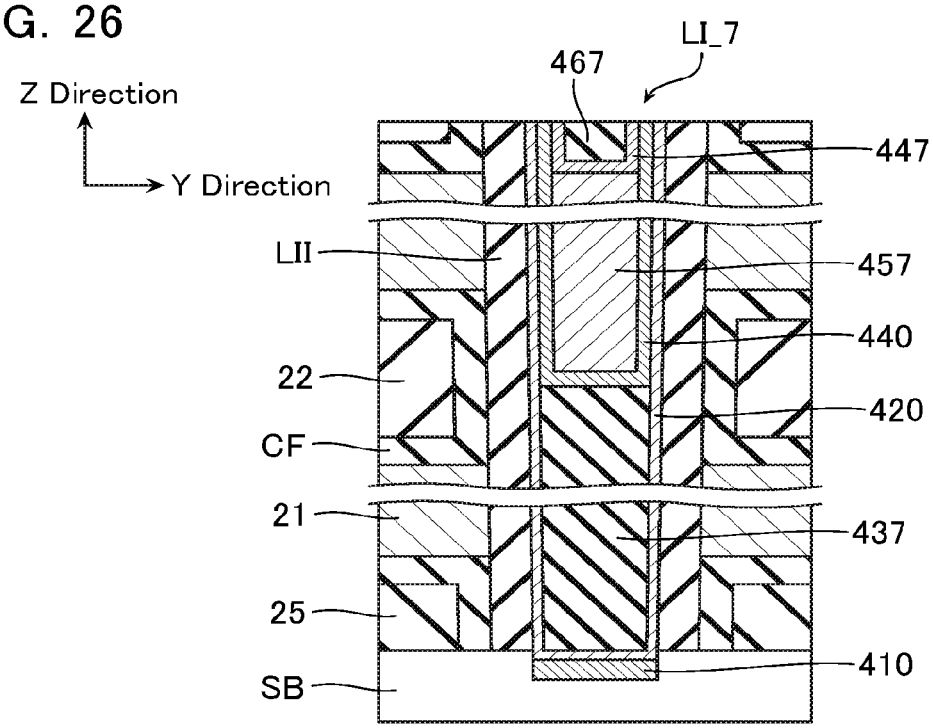
FIG. 26 is a cross-sectional view showing a modified example of the same nonvolatile semiconductor memory device.

FIG. 26 is a cross-sectional view showing a configuration of a source contact LI_7 according to a seventh modified example of the first embodiment. The source contact LI_7 shown in FIG. 26 comprises a silicon based layer 437, a metal layer 457, and a silicon based layer 467 that are stacked via the barrier layers 420 and 440, and a barrier layer 447. Note that the silicon based layer 437 and the silicon based layer 467 are configured from silicon oxide. Moreover, the metal layer 457 is configured from a material that may be applied to the metal layer 450. Moreover, the barrier layer 447 is configured from a material that may be applied to the barrier layer 440.

Second Embodiment

Semiconductor Memory Device

Figure 27:
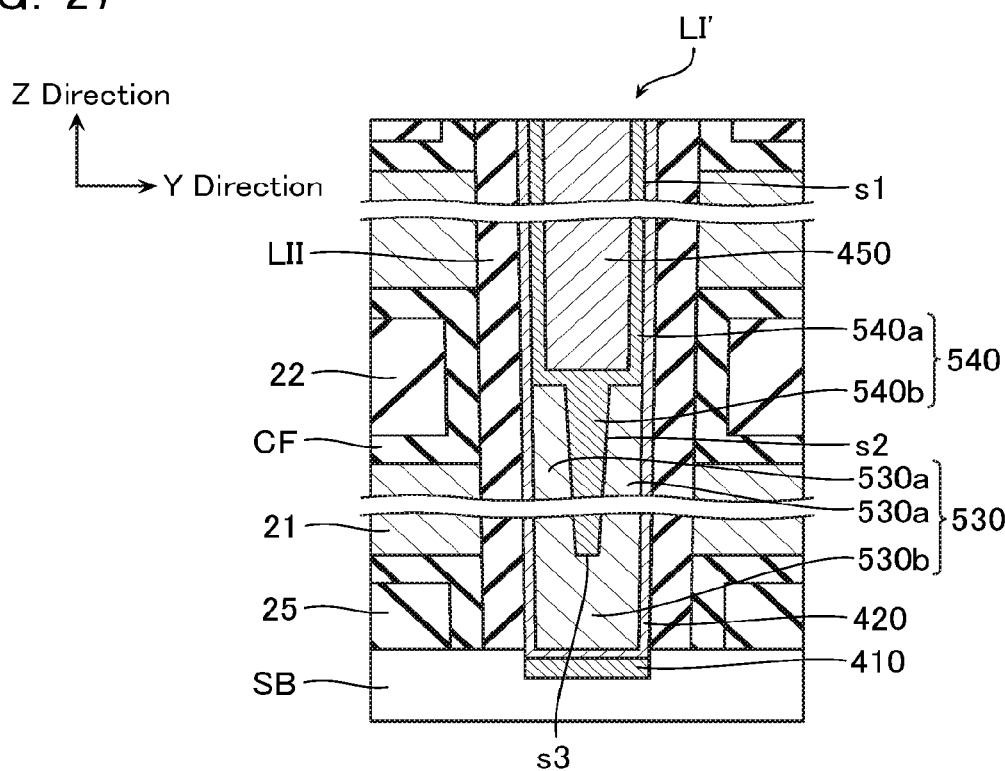
FIG. 27 is a cross-sectional view showing a configuration of part of a nonvolatile semiconductor memory device according to a second embodiment.

Next, a semiconductor memory device according to a second embodiment will be described with reference to FIG. 27. FIG. 27 is a cross-sectional view showing a configuration of a source contact LI' of the semiconductor memory device according to the second embodiment. Note that although the semiconductor memory device according to the second embodiment has a configuration of the source contact that differs from that of the semiconductor memory device according to the first embodiment, in other respects, it is configured similarly to the semiconductor memory device according to the first embodiment. Note that in the description below, portions similar to those of the semiconductor memory device described with reference to FIGS. 1 to 7 are assigned with identical reference symbols to those assigned in FIGS. 1 to 7, and descriptions thereof will be omitted.

As shown in FIG. 27, the source contact LI' according to the present embodiment comprises a U-shaped silicon based layer 530 having part of its upper surface subsiding in a downward direction. In other words, the silicon based layer 530 comprises: a pair of separated portions 530a that are separate in the Y direction; and a connecting portion 530b connected to these pair of separated portions 530a. Moreover, the source contact LI' according to the present embodiment comprises a barrier layer 540 contacting the subsided portion of the silicon based layer 530 upper surface. In other words, the barrier layer 540 comprises: a film portion 540a that covers a bottom surface and a side surface of the metal layer 450; and a protruding portion 540b that protrudes downwardly from a lower surface of the film portion 540a and extends in the X direction. Note that the connecting portion 530b is positioned below this protruding portion 540b. Furthermore, assuming, for example, a side surface in the Y direction of this film portion 540a to be a first side surface s1 and a side surface in the Y direction of the protruding portion 540b to be a second side surface s2, the first side surface s1 and the second side surface s2 are provided substantially parallel to a side surface of the barrier layer 420. Moreover, the second side surface s2 is provided at a position further from the barrier layer 420 than is the first side surface s1. Moreover, the silicon based layer 530 faces both side surfaces in the Y direction (second side surfaces s2) and a lower surface s3, of the protruding portion 540b.

Note that the silicon based layer 530 is configured from a material that may be applied to the silicon based layer 430 described with reference to FIG. 6. Moreover, the barrier layer 540 is configured from a material that may be applied to the barrier layer 440 described with reference to FIG. 6. Moreover, in other respects, the source contact LI' according to the present embodiment is configured similarly to the source contact LI according to the first embodiment.

[Method of Manufacturing]

Figure 28:
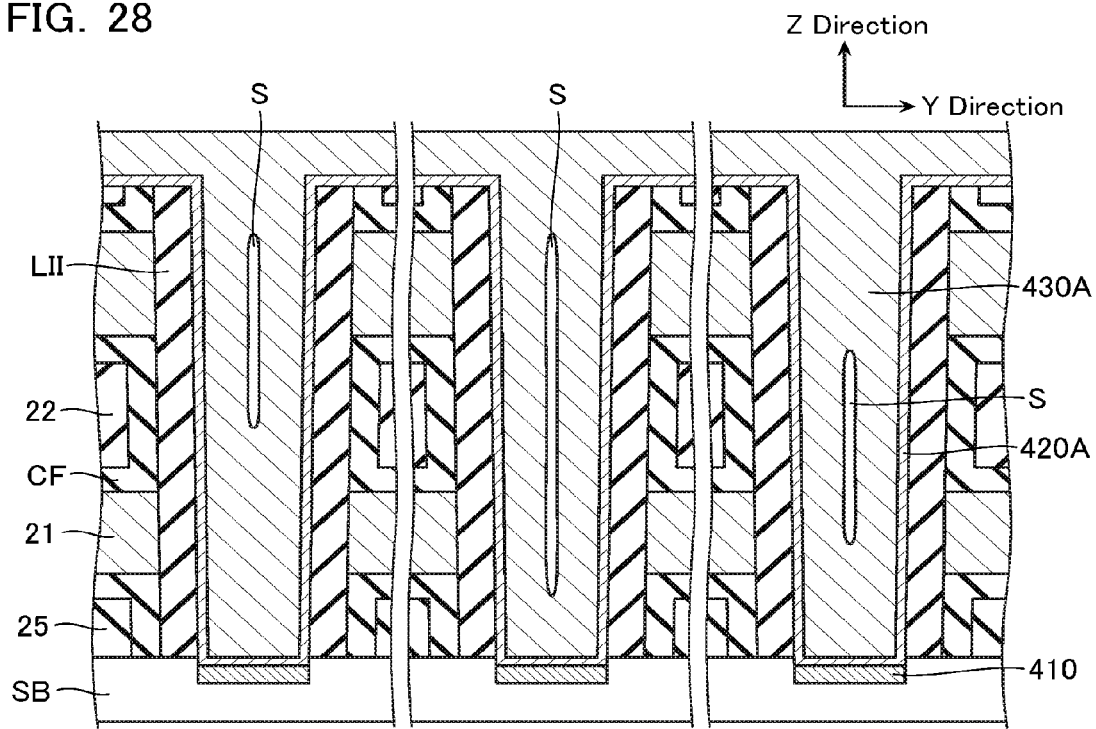
FIG. 28 is a schematic cross-sectional view for explaining a phenomenon that may occur in a method of manufacturing according to the first embodiment.
Figure 29:
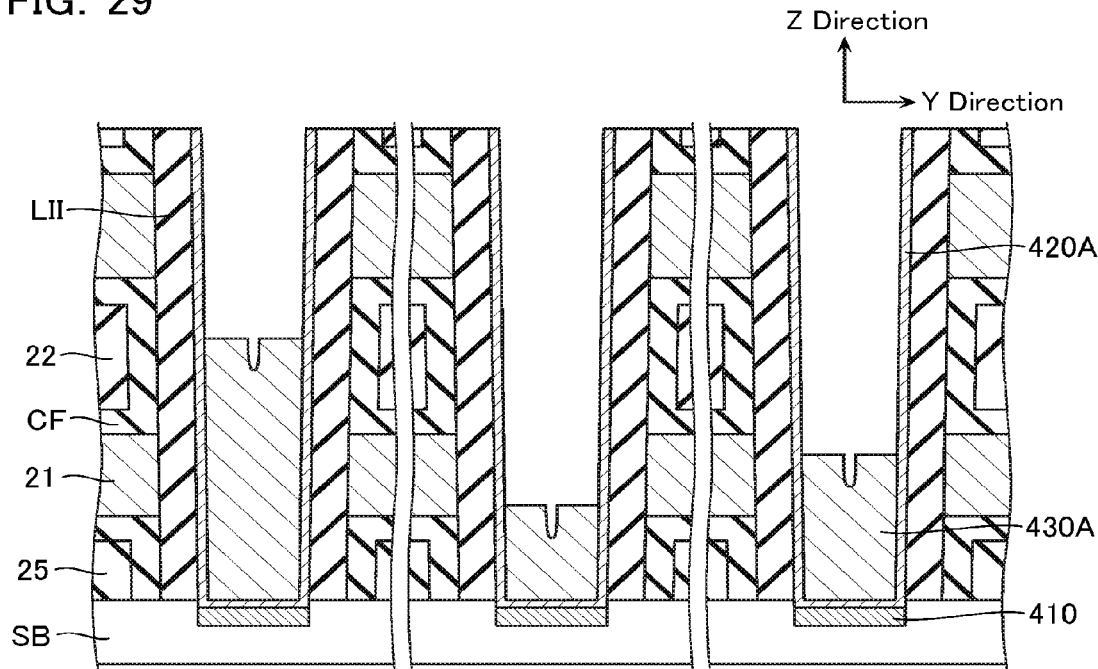
FIG. 29 is a schematic cross-sectional view for explaining the same phenomenon.

Next, a phenomenon that may occur in the method of manufacturing according to the first embodiment will be described with reference to FIGS. 28 and 29, then a method of manufacturing according to the second embodiment will be described with reference to FIGS. 30 to 33. FIGS. 28 and 29 are schematic cross-sectional view for explaining the phenomenon that may occur in the method of manufacturing according to the first embodiment. Moreover, FIGS. 30 to 33 are schematic cross-sectional views for explaining the method of manufacturing according to the second embodiment.

For example, as described with reference to FIG. 16, when the silicon based layer formation layer 430A is implanted in the inside of the opening op2, sometimes, as shown in FIG. 28, a seam (cavity) S gets generated in the silicon based layer formation layer 430A. In this case, as shown in FIG. 28, a range in the Z direction of the seam S varies according to the opening op2.

In this case, if it is attempted to make the upper surface of the silicon based layer formation layer 430A lower than the upper surface of the inter-layer insulating layer LII by a means such as etching back as described with reference to FIG. 17, then at a time point when the upper surface of the silicon based layer formation layer 430A has reached an upper end of the seam S, the inside of the seam S gets filled by an etchant (etching gas) of the dry etching. As a result, as shown in FIG. 29, a height of the upper surface of the silicon based layer formation layer 430A sometimes ends up varying according to the opening op2.

Figure 30:
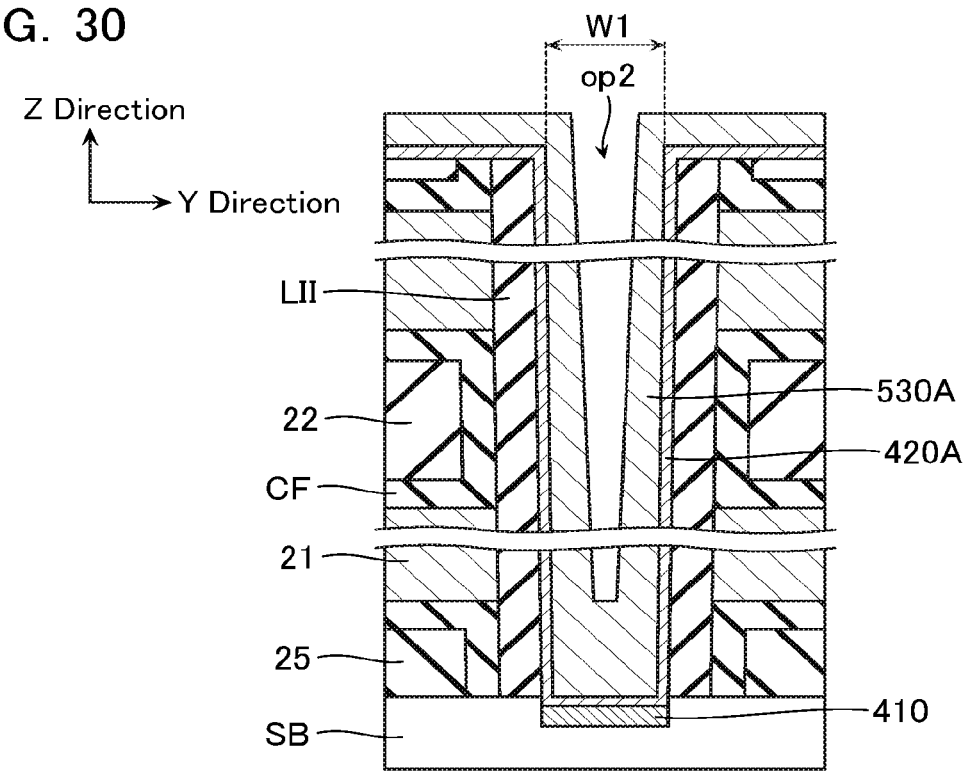
FIG. 30 is a cross-sectional view showing a manufacturing step of the nonvolatile semiconductor memory device according to the second embodiment.

In the method of manufacturing according to the present embodiment, in order to suppress such variation in the height of the upper surface of the silicon based layer formation layer 430A, a silicon based layer formation layer 530A is formed so as not to fill in the opening op2, as shown in FIG. 30.

That is, the method of manufacturing according to the present embodiment is performed similarly to the method of manufacturing according to the first embodiment up to the step described with reference to FIG. 15.

As shown in FIG. 30, the silicide layer 410 and the barrier layer formation layer 420A are deposited in the opening op2 by a similar method to that of the first embodiment. Then, in the opening op2, a bottom surface and a side surface of the barrier layer formation layer 420A is covered by the silicon based layer formation layer 530A. At this time, a film thickness of the silicon based layer formation layer 530A is at least made smaller than half of a spacing W1 of mutual barrier layer formation layers 420A covering sidewalls of the inter-layer insulating layers LII in the opening op2.

Figure 31:
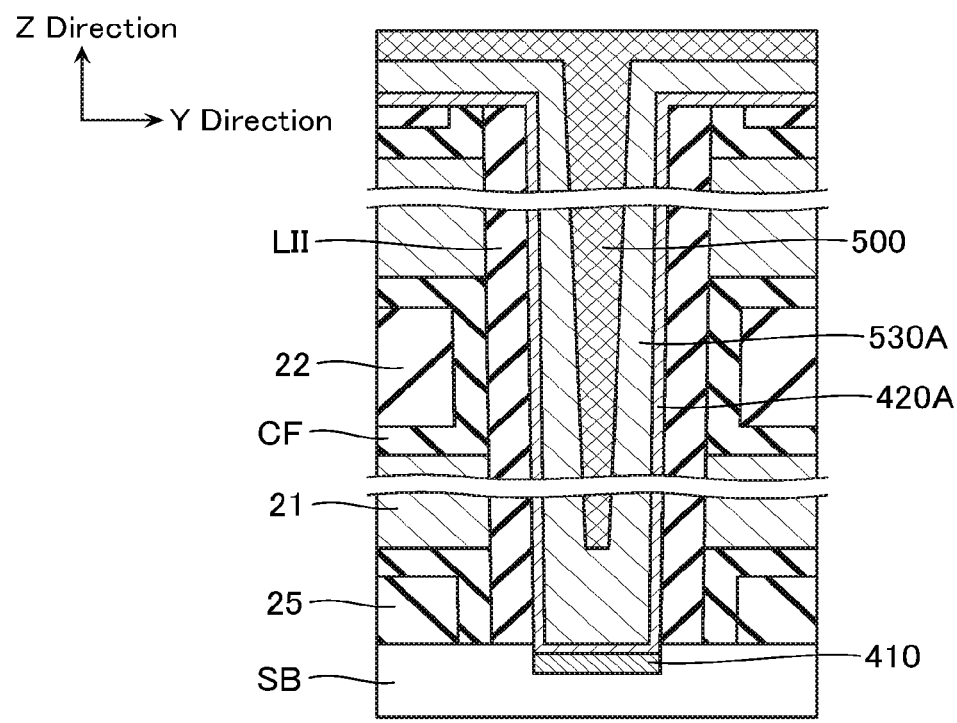
FIG. 31 is a cross-sectional view showing a manufacturing step of the same nonvolatile semiconductor memory device.

As shown in FIG. 31, a sacrifice layer 500 is formed so as to fill in an upper surface and a side surface of the silicon based layer formation layer 530A. Now, formation of the sacrifice layer 500 is performed by filling the inside of the opening op2 with a liquid material and solidifying this liquid material by heat treatment. Therefore, the sacrifice layer 500 can be suitably implanted in the opening op2 without the seam S of the kind described with reference to FIGS. 28 and 29 being generated.

Figure 32:
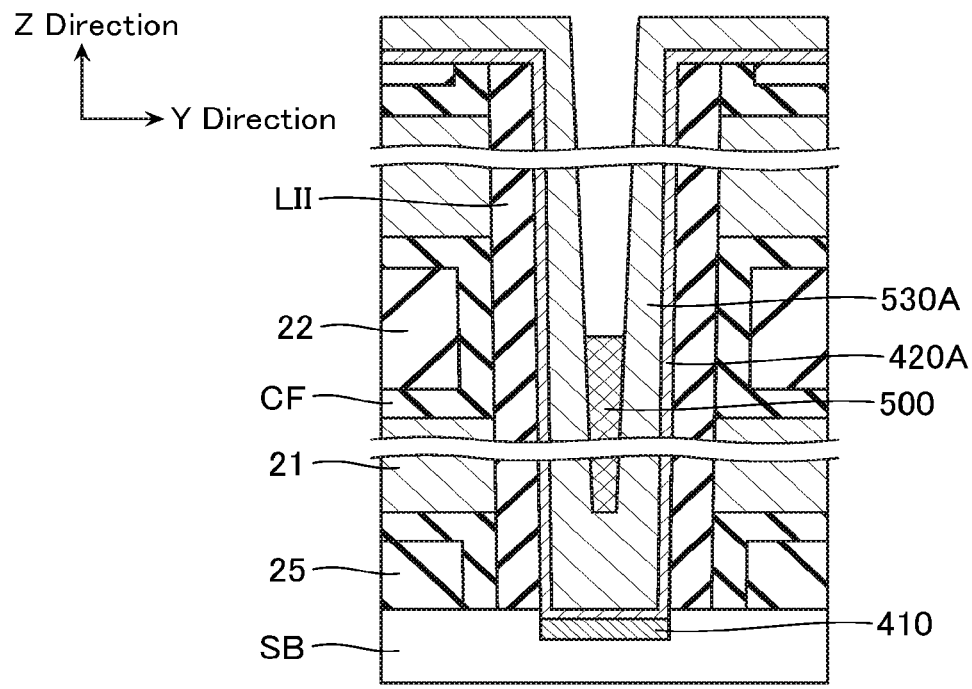
FIG. 32 is a cross-sectional view showing a manufacturing step of the same nonvolatile semiconductor memory device.

As shown in FIG. 32, an upper surface of the sacrifice layer 500 is made lower than the upper surface of the inter-layer insulating layer LII by a means such as etching back.

Figure 33:
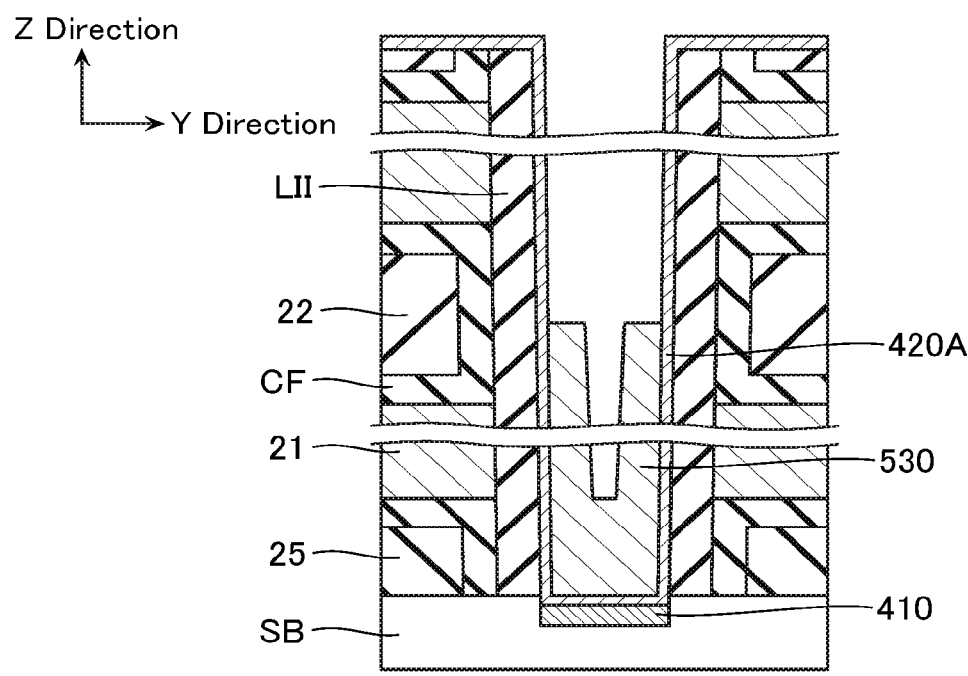
FIG. 33 is a cross-sectional view showing a manufacturing step of the same nonvolatile semiconductor memory device.

As shown in FIG. 33, the upper surface of the silicon based layer formation layer 530A is selectively lowered by a means such as isotropic etching to form the silicon based layer 530. Then, as shown in FIG. 33, the sacrifice layer 500 is removed.

As shown in FIG. 27, the barrier layer 540 and the metal layer 450 are formed above an upper surface of the silicon based layer 530, the likes of an unillustrated contact or the bit line BL and source line SL are formed, and thereby the nonvolatile semiconductor memory device according to the present embodiment is manufactured. Note that as shown in FIG. 27, in the present embodiment, the barrier layer 540 is implanted in a trench formed in the upper surface of the silicon based layer 530. Therefore, in the present embodiment, the barrier layer 540 may be formed more thickly compared to in the first embodiment.

Modified Examples of Semiconductor Memory Device According to Second Embodiment

Modified examples of the semiconductor memory device according to the second embodiment will be described with reference to FIGS. 34 to 37. FIGS. 34 to 37 are cross-sectional views showing configurations of source contacts of semiconductor memory devices according to the modified examples. Note that although the semiconductor memory devices according to these modified examples have configurations of the source contacts that differ from that of the above-described semiconductor memory device, in other respects, they are configured similarly to the above-described semiconductor memory device. Note that in the description below, portions similar to those of the source contact LI' described with reference to FIG. 27 are assigned with identical reference symbols to those assigned in FIG. 27, and descriptions thereof will be omitted.

Figure 34:
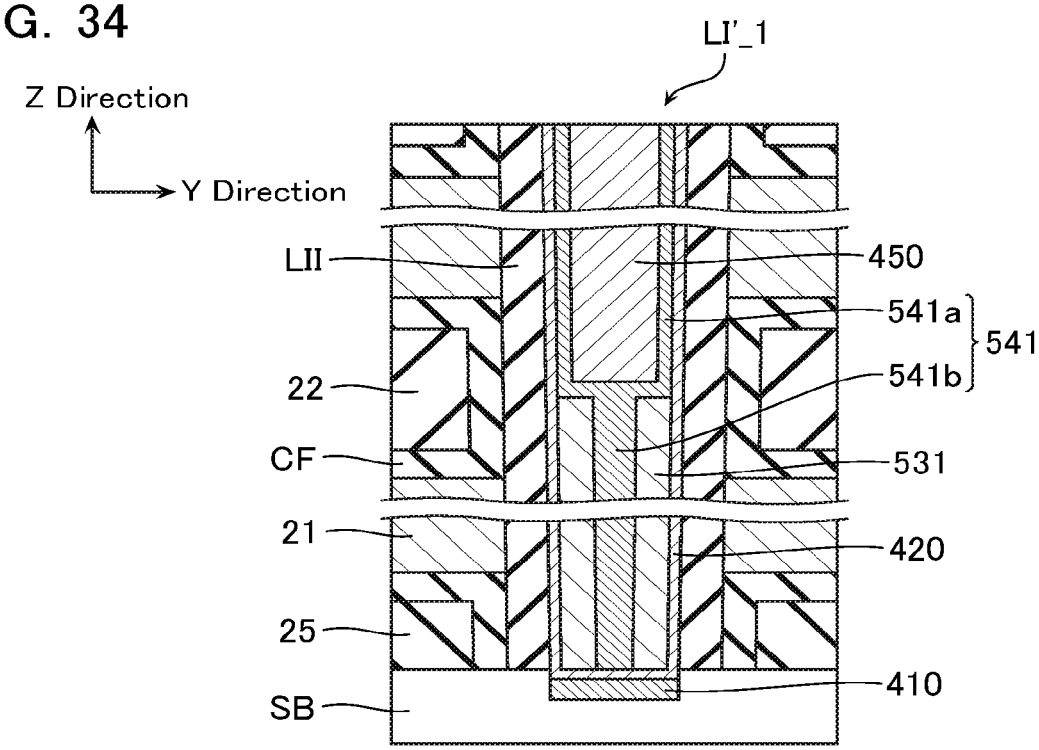
FIG. 34 is a cross-sectional view showing a modified example of the same nonvolatile semiconductor memory device.

FIG. 34 is a cross-sectional view showing a configuration of a source contact LI'_1 according to a first modified example of the second embodiment. As shown in FIG. 34, in the source contact LI'_1 according to the first modified example, a silicon based layer 531 comprises a pair of separated portions 531a that are divided in the Y direction. Moreover, a barrier layer 541 comprises: a film portion 541a that covers a lower surface and a side surface of the metal layer 450; and a protruding portion 541b that protrudes downwardly from a lower surface of the film portion 541a and extends in the X direction, and a lower end of the protruding portion 541b contacts an upper surface of the barrier layer 420. Note that the silicon based layer 531 is configured from a material that may be applied to the silicon based layer 430 described with reference to FIG. 6. Moreover, the barrier layer 541 is configured from a material that may be applied to the barrier layer 440 described with reference to FIG. 6.

Figure 35:
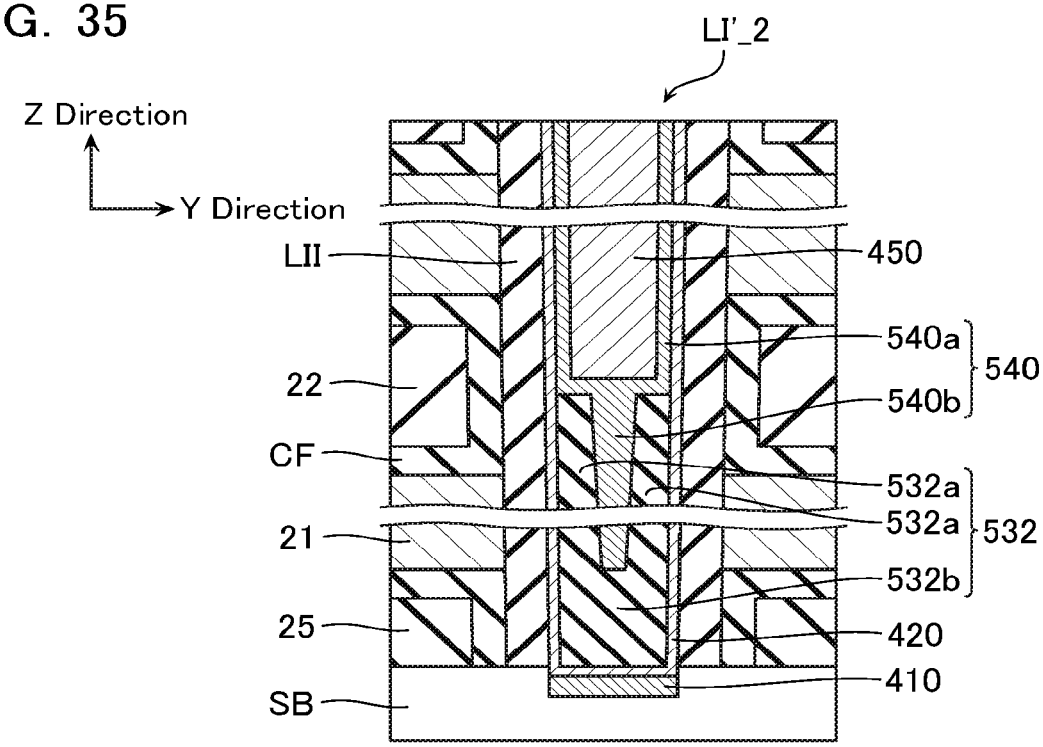
FIG. 35 is a cross-sectional view showing a modified example of the same nonvolatile semiconductor memory device.

FIG. 35 is a cross-sectional view showing a configuration of a source contact LI'_2 according to a second modified example of the second embodiment. The source contact LI'_2 shown in FIG. 35 is basically configured similarly to the source contact LI' described with reference to FIG. 27, but in the source contact LI'_2, a silicon based layer 532 is configured from silicon oxide. Note that as shown in FIG. 35, the silicon based layer 532 of the source contact LI'_2 according to the second modified example comprises: a pair of separated portions 532a that are separate in the Y direction; and a connecting portion 532b connected to these pair of separated portions 532a. Moreover, the connecting portion 532b is positioned below the protruding portion 540b.

Figure 36:
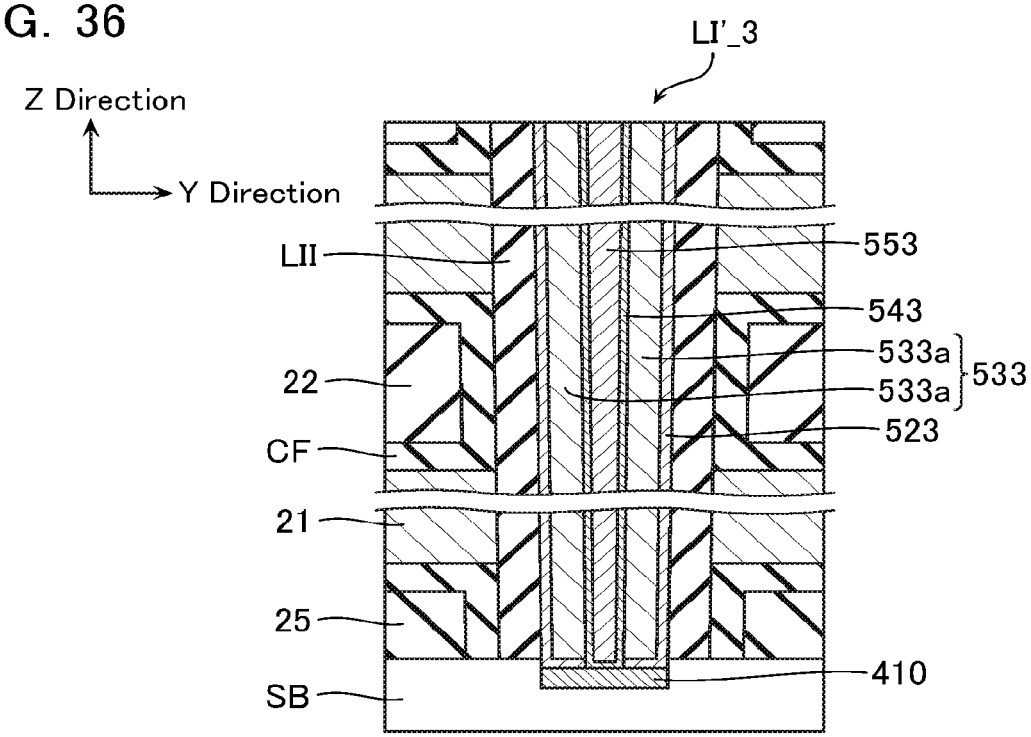
FIG. 36 is a cross-sectional view showing a modified example of the same nonvolatile semiconductor memory device.

FIG. 36 is a cross-sectional view showing a configuration of a source contact LI'_3 according to a third modified example of the second embodiment. As shown in FIG. 36, in the source contact LI'_3, a barrier layer 523, a silicon based layer 533, a barrier layer 543, and a metal layer 553 cover an entire sidewall of the inter-layer insulating layer LII. That is, the silicon based layer 533 is configured from a pair of separated portions 533a that are separate in the Y direction, and the metal layer 553 is positioned between this pair of separated 51 portions. Furthermore, the barrier layer 543 is positioned between the silicon based layer 533 and the metal layer 553, and covers a side surface and a lower surface of the metal layer 553. In other words, heights of upper surfaces of the barrier layer 523, the silicon based layer 533, the barrier layer 543, and the metal layer 553 match the height of the upper surface of the inter-layer insulating layer LII. Moreover, the barrier layer 543 faces a side surface in the Y direction of the metal layer 553, and the silicon based layer 533 faces a side surface in the Y direction of the metal layer 553 via the barrier layer 543. Such a configuration makes it possible for almost all of conduction between the silicide layer 410 and the unillustrated source line SL to be borne by the metal layer 553, and enables a resistance value of the source contact LI' 3 to be further lowered.

Figure 37:
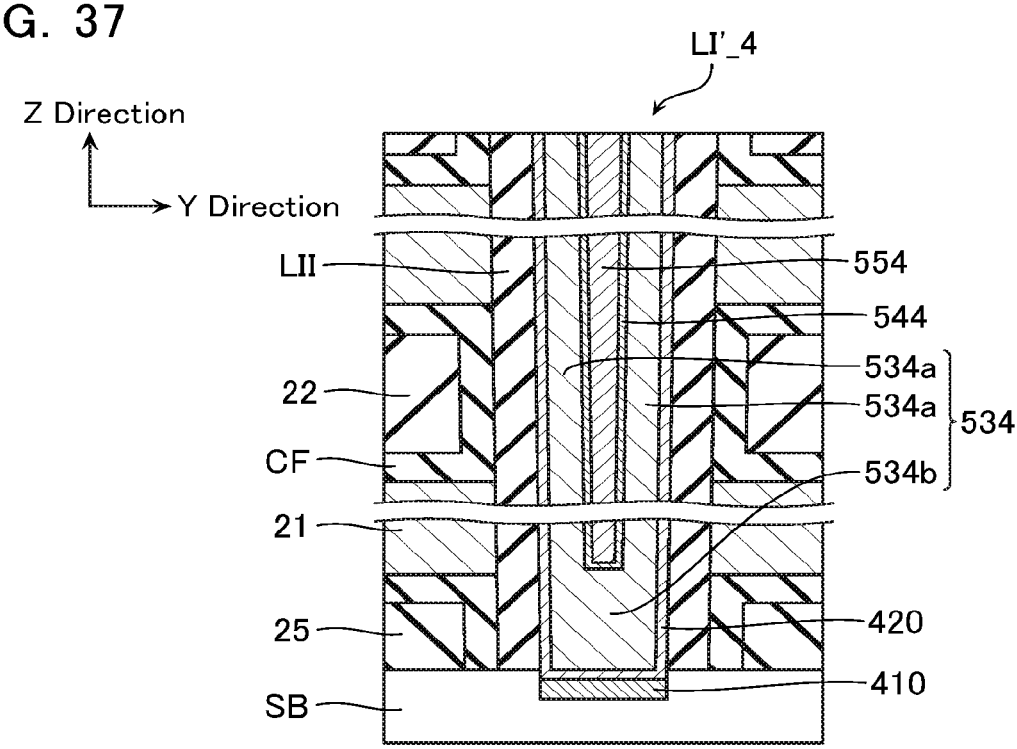
FIG. 37 is a cross-sectional view showing a modified example of the same nonvolatile semiconductor memory device.

FIG. 37 is a cross-sectional view showing a configuration of a source contact LI'_4 according to a fourth modified example of the second embodiment. As shown in FIG. 37, in the source contact LI'_4, a silicon based layer 534 covers an entire side surface and bottom surface of the barrier layer 420, a barrier layer 544 covers an entire side surface and bottom surface of the silicon based layer 534, and furthermore, a metal layer 554 cover an entire side surface and bottom surface of the barrier layer 544. The silicon based layer 534 may be, for example, formed from a heavily doped polysilicon. In the example shown in FIG. 37 also, the silicon based layer 534 includes a pair of separated portions 534a that are separate in the Y direction, and the metal layer 554 is positioned between this pair of separated portions 534a. Furthermore, the barrier layer 544 is positioned between the silicon based layer 534 and the metal layer 554, and covers a side surface and a lower surface of the metal layer 554. Note that as shown in FIG. 37, in the source contact LI'_4, heights of upper surfaces of the barrier layer 420, the silicon based layer 534, the barrier layer 544, and the metal layer 554 match the height of the upper surface of the inter-layer insulating layer LII. Moreover, the barrier layer 544 faces a side surface in the Y direction and a lower surface of the metal layer 554, and the silicon based layer 534 faces a side surface in the Y direction and a lower surface of the metal layer 554 via the barrier layer 544.

Third Embodiment

Semiconductor Memory Device

Figure 38:
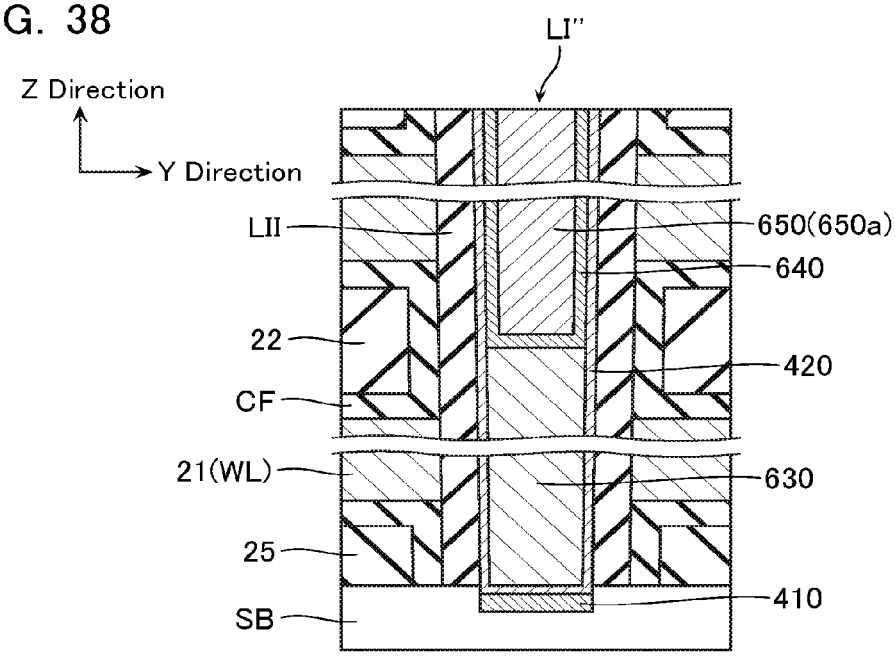
FIG. 38 is a cross-sectional view showing a configuration of part of a nonvolatile semiconductor memory device according to a third embodiment.
Figure 39:
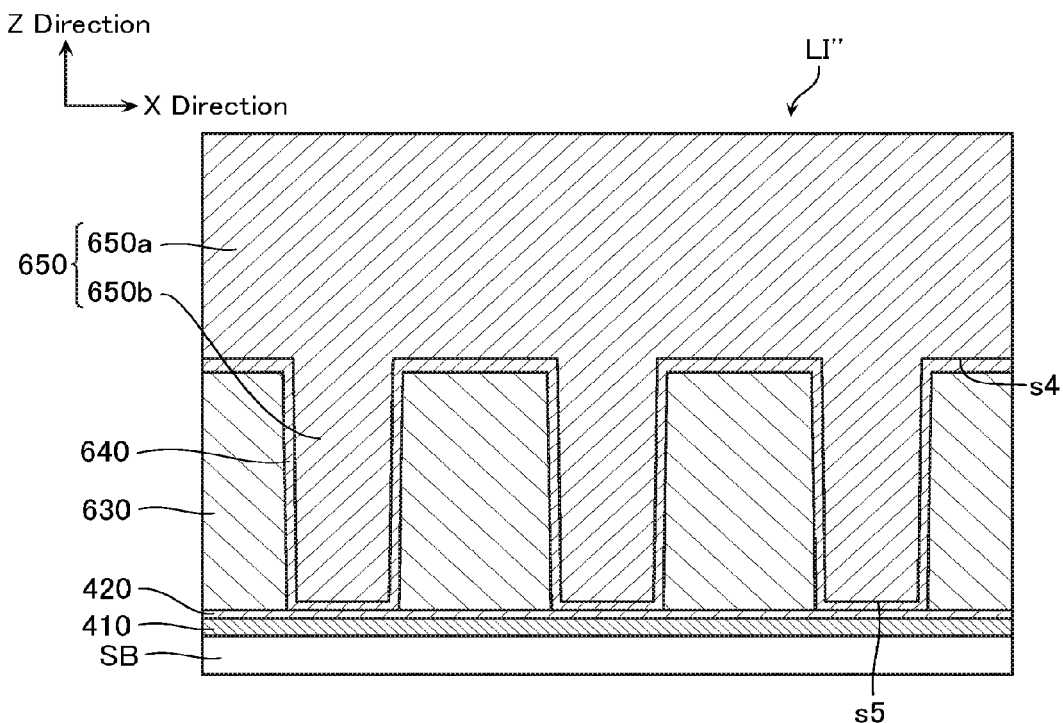
FIG. 39 is a cross-sectional view showing a configuration of part of the same nonvolatile semiconductor memory device.

Next, a configuration of a semiconductor memory device according to a third embodiment will be described with reference to FIGS. 38 and 39. FIGS. 38 and 39 are schematic cross-sectional views showing a configuration of part of the semiconductor memory device according to the present embodiment. Note that in the description below, portions similar to those of the first embodiment are assigned with identical reference symbols to those assigned in the first embodiment, and descriptions thereof will be omitted.

The semiconductor memory device according to the third embodiment is configured substantially similarly to the semiconductor memory device according to the first embodiment, but a configuration of a source contact differs. That is, as shown in FIG. 39, in a source contact LI" according to the present embodiment, a height of a lower surface of a metal layer 650 is provided low with a certain spacing. In other words, the metal layer 650 contacts the silicide layer 410, via the barrier layer 420 and a barrier layer 640, at a certain interval. In other words, the metal layer 650 comprises: a wiring portion 650a having the X direction as its longer direction; and a protruding portion 650b that is provided in plurality in the X direction and protrudes downwardly from a lower surface of the wiring portion 650a. Furthermore, assuming, for example, a lower surface of this wiring portion 650a to be a first lower surface s4 and a lower surface of the protruding portion 650b to be a second lower surface s5, the first lower surface s4 and the second lower surface s5 are provided parallel to the substrate SB. Moreover, the second lower surface s5 is provided at a position closer to the substrate SB than is the first lower surface s4. Therefore, as shown in FIG. 39, the barrier layer 640 according to the present embodiment is formed along a lower surface and a side surface of the metal layer 650, and a silicon based layer 630 is divided in the X direction. Moreover, the metal layer 650 contacts the barrier layer 420, via the barrier layer 640, at the second lower surface s5. Note that the silicon based layer 630 is configured from a material that may be applied to the silicon based layer 430. Moreover, the barrier layer 640 is configured from a material that may be applied to the barrier layer 440. Moreover, the metal layer 650 is configured from a material that may be applied to the metal layer 450.

Such a configuration makes it possible for almost all of conduction between the silicide layer 410 and the unillustrated source line SL to be borne by the metal layer 650, and enables a resistance value of the source contact LI" to be even further lowered compared to in the first embodiment. Moreover, in the present embodiment, the lower surface of the metal layer 650 contacts the substrate SB at a plurality of places, via the barrier layer 420 and the barrier layer 640. Therefore, by making contact in parallel between a plurality of places on the substrate SB, it is possible to prevent a concentration of current.

[Method of Manufacturing]

A method of manufacturing a semiconductor memory device according to the present embodiment will be described with reference to FIGS. 40 to 47. FIGS. 40 to 47 are schematic cross-sectional views for explaining the method of manufacturing a semiconductor memory device according to the present embodiment.

The method of manufacturing according to the present embodiment is performed similarly to the method of manufacturing according to the first embodiment up to the step described with reference to FIG. 15.

Figure 40:
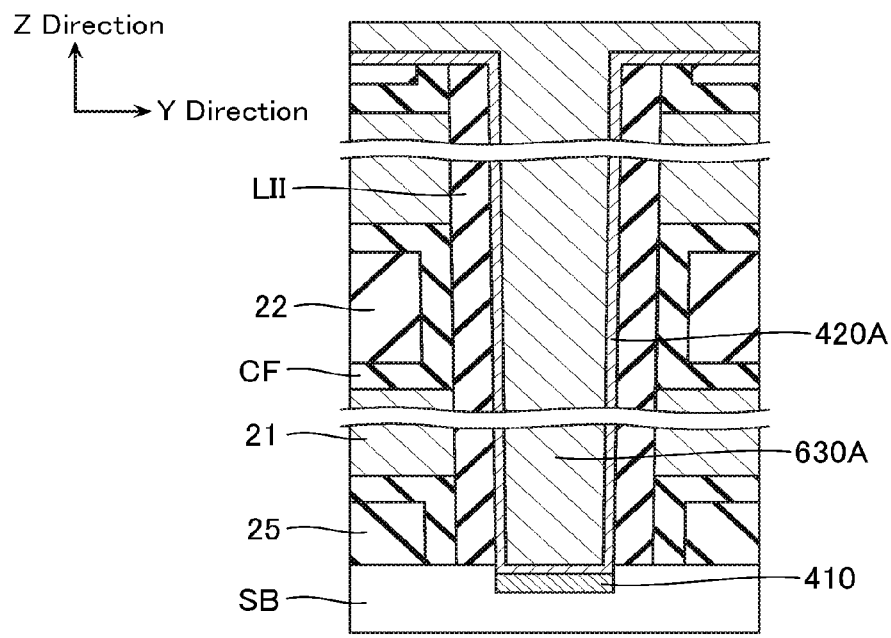
FIG. 40 is a cross-sectional view showing a manufacturing step of the same nonvolatile semiconductor memory device.
Figure 41:
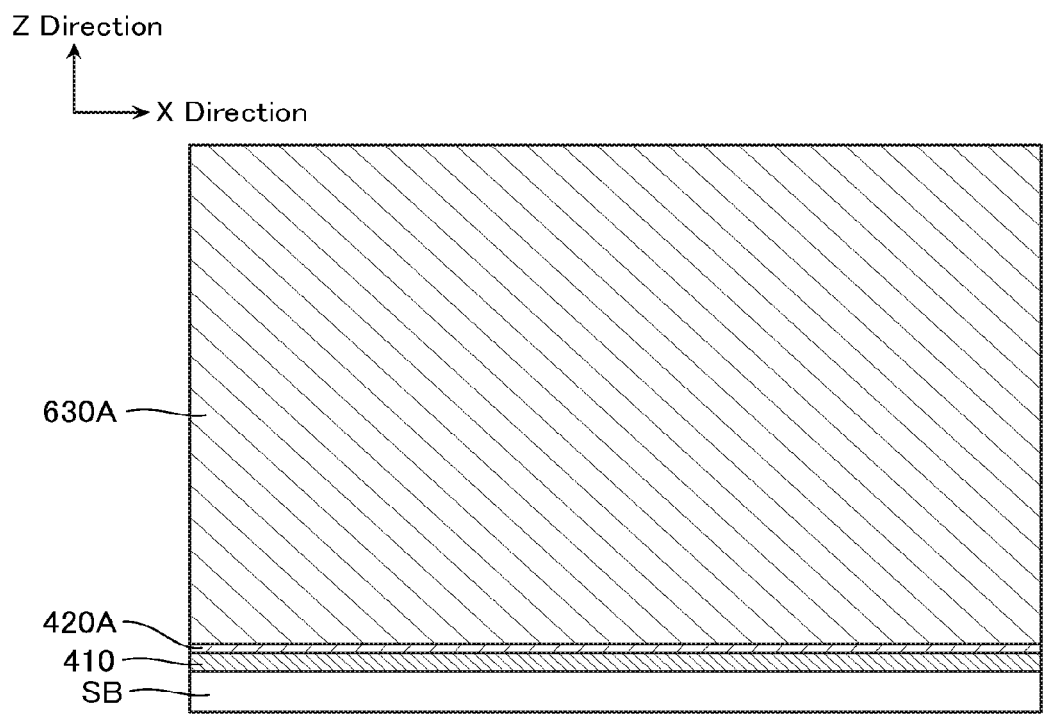
FIG. 41 is a cross-sectional view showing a manufacturing step of the same nonvolatile semiconductor memory device.

As shown in FIGS. 40 and 41, the silicide layer 410 and the barrier layer formation layer 420A are deposited in the opening op2 by a similar method to that of the first embodiment. Then, in the opening op2, a silicon based layer formation layer 630A is implanted on a bottom surface and a side surface of the barrier layer formation layer 420A.

Figure 42:
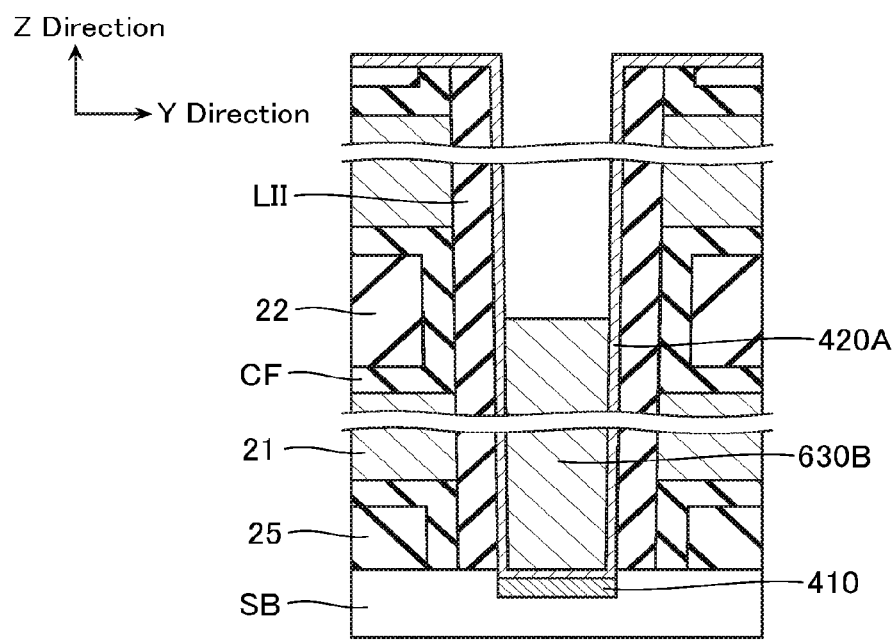
FIG. 42 is a cross-sectional view showing a manufacturing step of the same nonvolatile semiconductor memory device.
Figure 43:
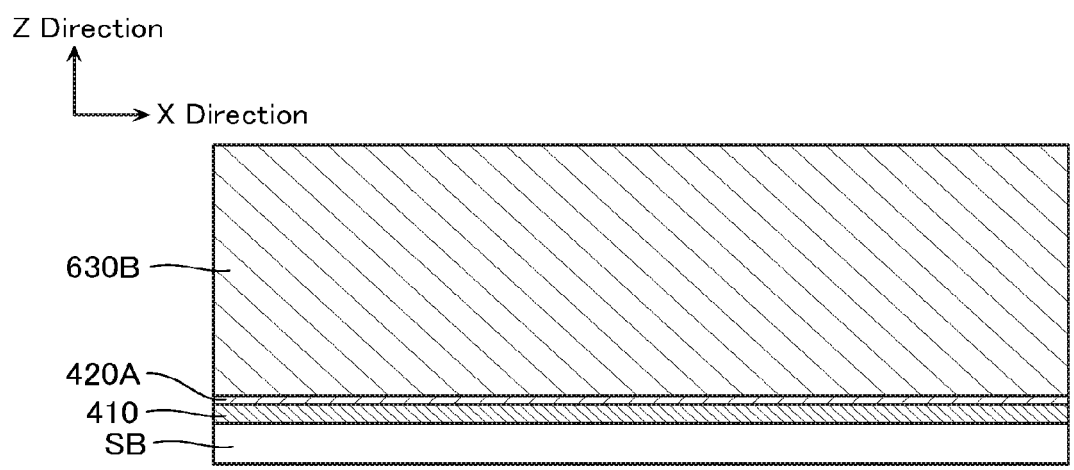
FIG. 43 is a cross-sectional view showing a manufacturing step of the same nonvolatile semiconductor memory device.

As shown in FIGS. 42 and 43, a means such as etching back is performed, an upper surface of the silicon based layer formation layer 630A is made lower than the upper surface of the inter-layer insulating layer LII, and a silicon based layer formation layer 630B is formed.

Figure 44:
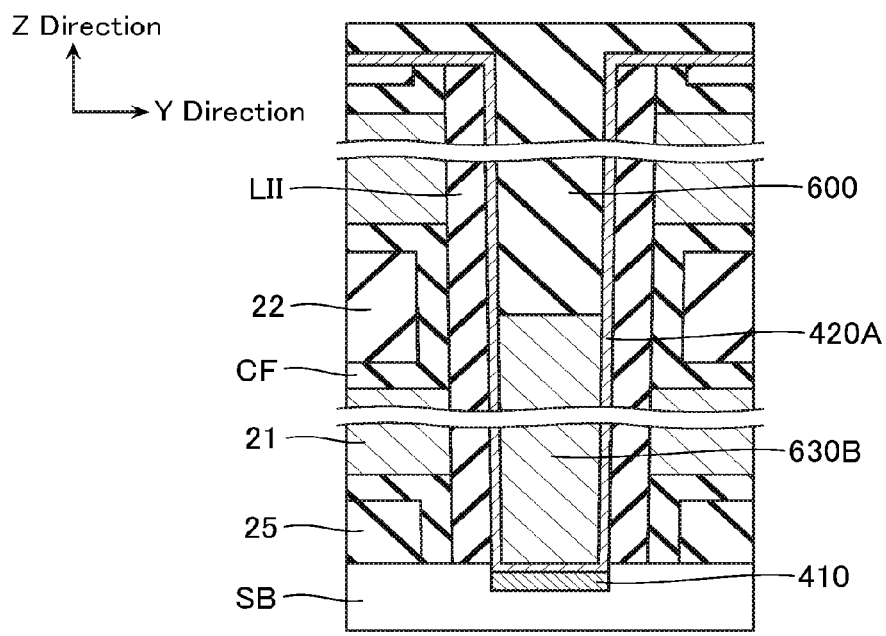
FIG. 44 is a cross-sectional view showing a manufacturing step of the same nonvolatile semiconductor memory device.
Figure 45:
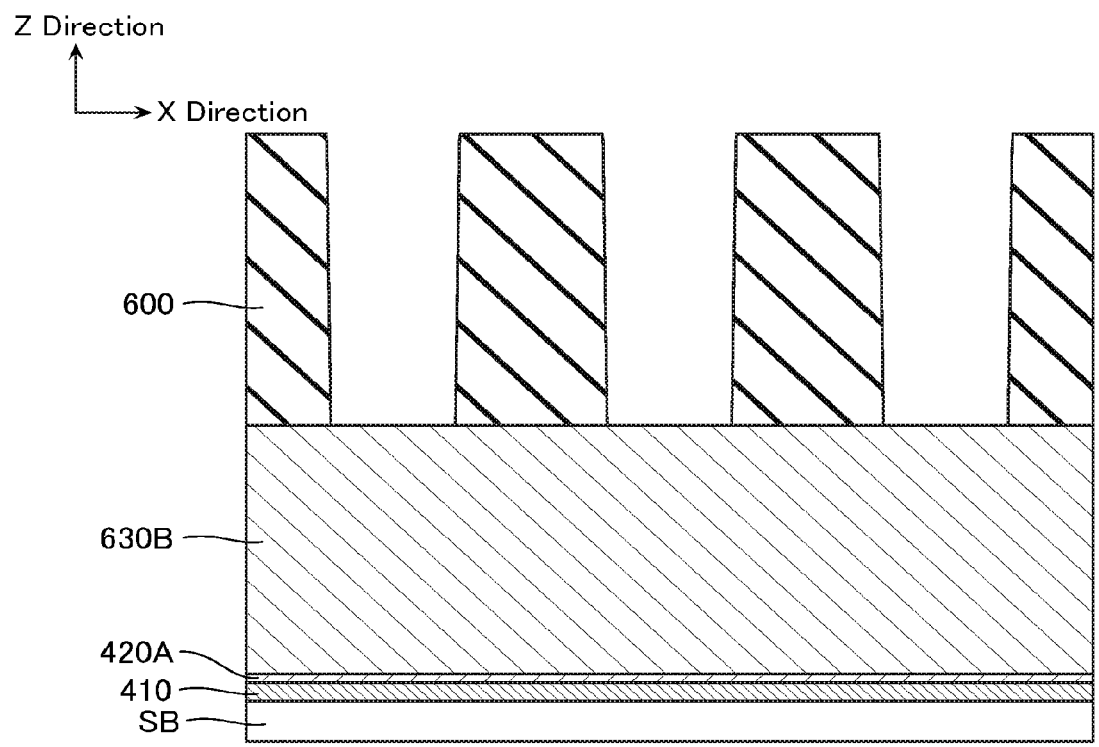
FIG. 45 is a cross-sectional view showing a manufacturing step of the same nonvolatile semiconductor memory device.

As shown in FIGS. 44 and 45, a resist 600 is deposited on an upper surface of the silicon based layer formation layer 630B. Moreover, as shown in FIG. 45, the resist 600 is divided in the X direction by a means such as photolithography.

Figure 46:
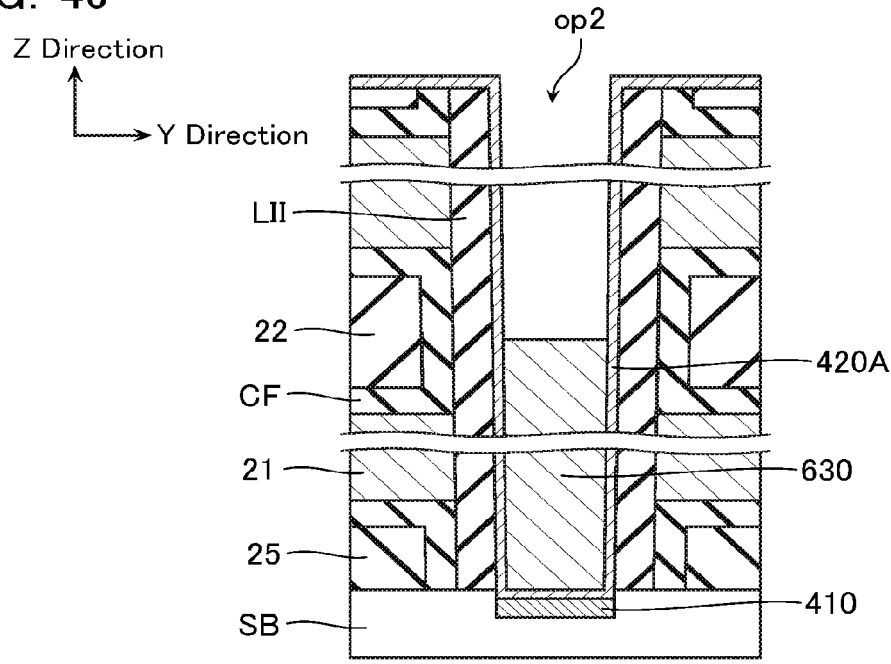
FIG. 46 is a cross-sectional view showing a manufacturing step of the same nonvolatile semiconductor memory device.
Figure 47:
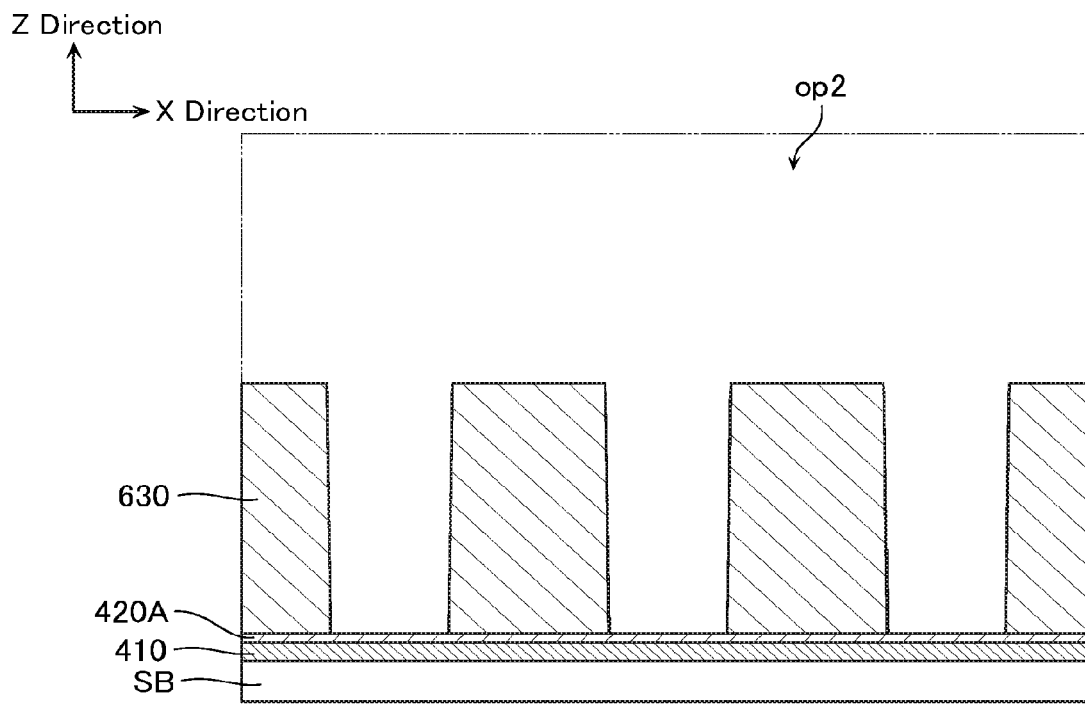
FIG. 47 is a cross-sectional view showing a manufacturing step of the same nonvolatile semiconductor memory device.

As shown in FIGS. 46 and 47, anisotropic etching is performed using the resist 600 as a mask, the silicon based layer formation layer 630B is divided in the X direction, and thereby the silicon based layer 630 is formed.

As shown in FIGS. 38 and 39, a barrier layer formation layer that forms the barrier layer 640 is formed on an upper surface and a side surface of the silicon based layer 630 and on an upper surface of the barrier layer 420, and furthermore, a metal layer formation layer that forms the metal layer 650 is formed in the opening op2. Moreover, planarization by a means such as CMP is performed using as a stopper a portion positioned in an uppermost layer, of the inter-layer insulating layer LII or the inter-layer insulating layer 22, and the barrier layer 420, the barrier layer 640, and the metal layer 650 are formed. Subsequently, the likes of an unillustrated contact or the bit line BL and source line SL are formed, and thereby the semiconductor memory device according to the present embodiment is manufactured.

Note that, for example, in the step described with reference to FIG. 40, in the opening op2, the bottom surface and the side surface of the barrier layer formation layer 420 were implanted by the silicon based layer formation layer 630A. However, it is also possible, for example, that the silicon based layer formation layer 630A is formed so as not to fill in the opening op2, similarly to in the step described with reference to FIG. 30. Furthermore, the silicon based layer 630 according to the present embodiment was formed from polysilicon, but the silicon based layer may be formed from silicon oxide, for example.

Other Embodiments

The first through third embodiments described the configuration of a source contact in a semiconductor memory device that stores data by accumulating a charge in a charge accumulation layer. However, it is possible for a similar configuration to that of the source contact according to the first through third embodiments to be applied to, for example, a configuration of a kind formed in a plate shape, contacting the substrate at its lower surface, and in which lowering of wiring line resistance and contact resistance with the substrate are required.

Moreover, in the source contact according to the first through third embodiments, the metal layer was configured from tungsten. However, it is also possible for a metal other than tungsten to be adopted as the metal layer, provided it is a metal whose thermal expansion coefficient has a positive value.

In addition, the source contact according to the first through third embodiments comprised a silicon based layer that includes a material including silicon. However, when, for example, the substrate is configured from a material other than silicon, a layer including the material configuring the substrate may be adopted instead of a silicon based layer.

Moreover, in the first through third embodiments, the semiconductor layer 23 and the source contact were connected via an outer surface of the substrate SB configured from the likes of silicon. However, the semiconductor layer 23 and the contact may be connected at their lower ends by a conductive layer of the likes of a metal or polysilicon. In this case, for example, a wiring line layer including the likes of a metal or polysilicon, and so on, may be formed on the substrate SB.

Figure 48:
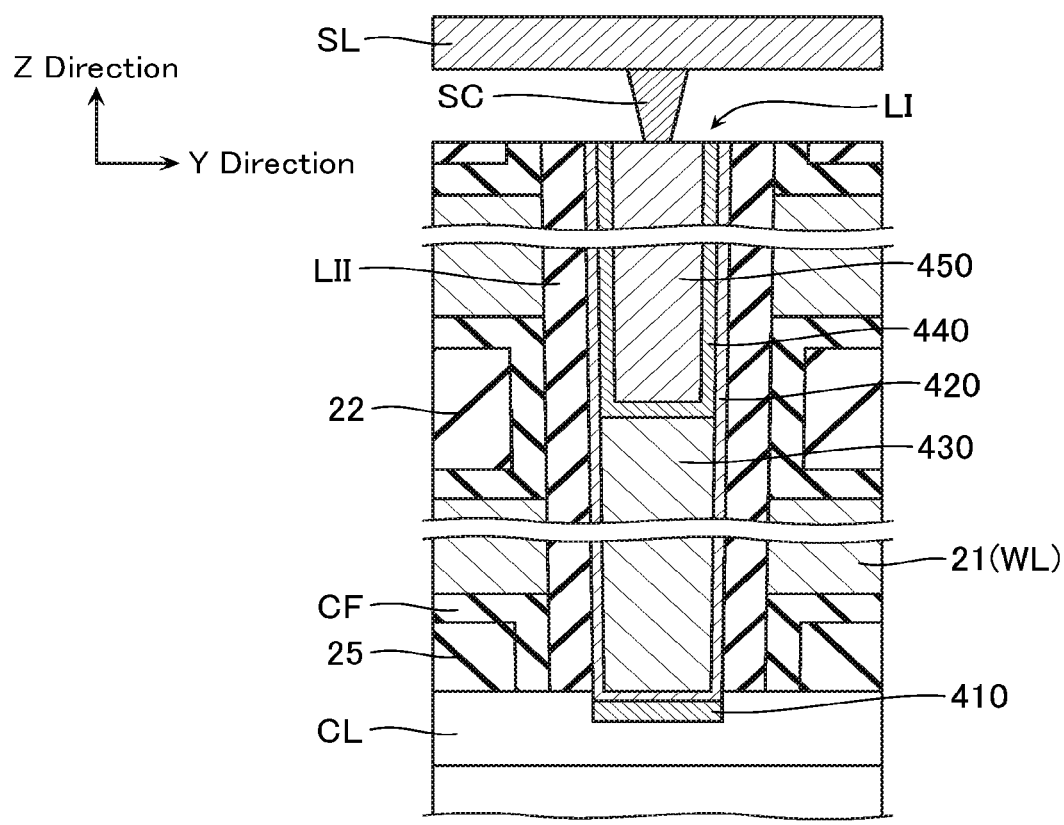
FIG. 48 is a cross-sectional view showing a configuration of part of the other nonvolatile semiconductor memory device.

Moreover, in the above embodiments, the source contact LI is connected to the substrate SB. However, as shown in FIG. 48, the source contact LI may be connected to the other conductive layer CL such as a semiconductor layer, a metal layer and the like provided above the substrate SB.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory string comprising a plurality of memory cells connected in series therein;
   a first wiring electrically connected to one end of the memory string; and
   a contact electrically connected between the memory string and the first wiring,
   the memory string comprising:
      a plurality of control gate electrodes as first conductive layers stacked above a substrate; and
      a semiconductor layer having one end electrically connected to the contact and having as its longer direction a direction perpendicular to the substrate, the semiconductor layer facing the plurality of control gate electrodes, and
      the contact comprising a contact layer, the contact layer having a plate-like shape whose longer direction is a first direction parallel to the substrate, and the contact layer having its lower surface electrically connected to the one end of the semiconductor layer, and
   the contact layer comprising:
      a metal layer that includes tungsten;
      a silicon based layer that includes a material including silicon; and
      a second conductive layer that covers side surfaces of the metal layer and the silicon based layer.

2. The semiconductor memory device according to claim 1, wherein
   the metal layer has the first direction as its longer direction, and
   the second conductive layer covers both side surfaces in a second direction intersecting the first direction, of the metal layer and the silicon based layer.

3. The semiconductor memory device according to claim 2, wherein
   the contact layer further comprises a third conductive layer provided between the metal layer and the silicon based layer.

4. The semiconductor memory device according to claim 3, wherein
   the silicon based layer is positioned below the metal layer.

5. The semiconductor memory device according to claim 3, wherein
   the silicon based layer comprises a pair of separated portions that are separate in the second direction, the metal layer is positioned between the pair of separated portions of the silicon based layer, and the third conductive layer is positioned between the separated portion of the silicon based layer and the metal layer.

6. The semiconductor memory device according to claim 3, wherein one of the layers of the metal layer and the silicon based layer is positioned upper than the other of the layers, the third conductive layer faces both side surfaces in the second direction and a lower surface of the one of the layers, and the sum of film thicknesses of portions facing the both side surfaces in the second direction of the one of the layers, of the second conductive layer and the third conductive layer is larger than a film thickness of a portion facing both side surfaces of the other of the layers, of the second conductive layer.

7. The semiconductor memory device according to claim 4, wherein the silicon based layer comprises a pair of separated portions that are separate in the second direction, the third conductive layer comprises:

a film portion that covers a side surface and a lower surface of the metal layer; and a first protruding portion that protrudes downwardly and has the first direction as its longer direction, and the first protruding portion of the third conductive layer is positioned between the pair of separated portions of the silicon based layer.

8. The semiconductor memory device according to claim 7, wherein the silicon based layer further comprises a connecting portion connected to the pair of separated portions, and the connecting portion of the silicon based layer is positioned below the first protruding portion.

9. The semiconductor memory device according to claim 4, wherein the metal layer comprises:

a first lower surface; and a second lower surface provided at a position closer to the substrate than the first lower surface, and the metal layer is connected at its second lower surface to the second conductive layer, via the third conductive layer.

10. The semiconductor memory device according to claim 5, wherein the silicon based layer further comprises a connecting portion connected to the pair of separated portions, and the connecting portion of the silicon based layer is positioned below the metal layer.

11. The semiconductor memory device according to claim 1, wherein the contact layer further comprises a fourth conductive layer which is positioned lower than the metal layer, the silicon based layer, and the second conductive layer, and which faces an upper surface of the substrate.

12. The semiconductor memory device according to claim 11, wherein the fourth conductive layer includes a metal silicide.

13. The semiconductor memory device according to claim 1, wherein the silicon based layer includes polysilicon or silicon oxide.

14. The semiconductor memory device according to claim 3, wherein at least one of the second conductive layer and the third conductive layer includes at least one of titanium and titanium nitride.

15. A semiconductor memory device, comprising:

a plurality of first conductive layers stacked above a substrate;

a semiconductor layer having as its longer direction a direction perpendicular to the substrate, the semiconductor layer facing the plurality of first conductive layers;

a contact layer having a plate-like shape whose longer direction is a first direction parallel to the substrate, the contact layer having its lower surface electrically connected to one end of the semiconductor layer; and a first wiring electrically connected to the contact layer, and the contact layer comprising:

a metal layer;

a silicon based layer that includes a material including silicon; and a second conductive layer that covers side surfaces of the metal layer and the silicon based layer.

16. The semiconductor memory device according to claim 15, wherein the metal layer has the first direction as its longer direction, and the second conductive layer covers both side surfaces in a second direction intersecting the first direction, of the metal layer and the silicon based layer.

17. The semiconductor memory device according to claim 15, wherein the contact layer further comprises a third conductive layer provided between the metal layer and the silicon based layer.

18. The semiconductor memory device according to claim 17, wherein the metal layer comprises:

a first lower surface; and a second lower surface provided at a position closer to the substrate than the first lower surface, and the metal layer is connected at its second lower surface to the second conductive layer, via the third conductive layer.

19. The semiconductor memory device according to claim 15, wherein the contact layer further comprises a fourth conductive layer which is positioned lower than the metal layer, the silicon based layer, and the second conductive layer, and which faces an upper surface of the substrate.

20. The semiconductor memory device according to claim 15, wherein the silicon based layer is positioned below the metal layer.

* * * * *